US008368132B2

(12) United States Patent
Nagai

(10) Patent No.: US 8,368,132 B2
(45) Date of Patent: Feb. 5, 2013

(54) FERROELECTRIC MEMORY AND MANUFACTURING METHOD THEREOF

(75) Inventor: Kouichi Nagai, Yokohama (JP)

(73) Assignee: Fujitsu Semiconductor Limited, Yokohama (JP)

(*) Notice: Subject to any disclaimer, the term of this patent is extended or adjusted under 35 U.S.C. 154(b) by 34 days.

(21) Appl. No.: 12/873,720

(22) Filed: Sep. 1, 2010

(65) Prior Publication Data

US 2010/0320519 A1 Dec. 23, 2010

Related U.S. Application Data

(63) Continuation of application No. PCT/JP2008/056335, filed on Mar. 31, 2008.

(51) Int. Cl.
*H01L 29/76* (2006.01)
*H01L 21/00* (2006.01)
*H01L 21/8242* (2006.01)

(52) U.S. Cl. . 257/295; 257/296; 257/532; 257/E21.663; 257/E27.104; 438/3; 438/241; 438/244; 438/253

(58) Field of Classification Search .................. 257/295, 257/296, 532; 438/3, 241, 259, 244, 253, 438/258

See application file for complete search history.

(56) References Cited

U.S. PATENT DOCUMENTS 6,744,085 B2 6/2004 Maruyama et al.
7,153,705 B2 12/2006 Maruyama et al.
7,312,091 B2 * 12/2007 Lee et al. .......................... 438/3
7,462,898 B2 * 12/2008 Ozaki .......................... 257/295
7,633,107 B2 12/2009 Matsuura
2007/0045688 A1 3/2007 Sashida
2007/0080382 A1 4/2007 Kikuchi et al.
2007/0113189 A1 * 5/2007 Ramani et al. ................ 715/746
2007/0228431 A1 10/2007 Wang
2008/0073685 A1 * 3/2008 Wang .......................... 257/295
2008/0111172 A1 * 5/2008 Wang et al. .................. 257/295

FOREIGN PATENT DOCUMENTS

JP 11-040748 A 2/1999
JP 2002-299576 A 10/2002
JP 2003-133531 A 5/2003
JP 2003-258201 A 9/2003
JP 2007-067294 A 3/2007
JP 2007-103875 A 4/2007
JP 2007-266429 A 10/2007
JP 2007-273899 A 10/2007
WO 98/06131 A1 2/1998

OTHER PUBLICATIONS

International Search Report of PCT/JP2008/056335, mailed Jun. 10, 2008.

* cited by examiner

*Primary Examiner* — Hsien Ming Lee
(74) *Attorney, Agent, or Firm* — Westerman, Hattori, Daniels & Adrian, LLP

(57) ABSTRACT

Provided is a ferroelectric memory including a silicon substrate, a transistor formed on the silicon substrate, and a ferroelectric capacitor formed above the transistor. The ferroelectric capacitor includes a lower electrode, a ferroelectric film formed on the lower electrode, an upper electrode formed on the ferroelectric film, and a metal film formed on the upper electrode.

12 Claims, 34 Drawing Sheets

| Ave | 407.5 |
|---|---|
| 3σ | 41.6 |

| Ave | 401.3 |
|---|---|
| 3σ | 41.3 |

| Ave | 398.6 |
| --- | --- |
| $3\sigma$ | 36.1 |

$R_{pad}$
$R_{cell}$
$R_{logic}$
$R_{peripheral}$
49d
49c
48
30
39a
35
39b
39c
36
40
46
45
44 oxidation annealing
49d
30
39a
35
39b
39c
36
48
40
46
45
44

R_peripheral
R_logic
R_cell
R_pad
40
46
45
44
47
36
30
35
26
20
49a
48a

R_peripheral
R_logic
R_cell
R_pad
40
46
45
44
47
51
36
30
35
49a
48a $R_{peripheral}$
$R_{logic}$
$R_{cell}$
$R_{pad}$
Q
49a 48a 47a
58a
57a
57
55
53
46
45
44
36
35
39a
39b
39c
30

$R_{peripheral}$
$R_{logic}$
$R_{cell}$
$R_{pad}$
Q
55
53
46
45
44
30
36
35
39a
39b
39c
47a
48a
49a
58a
60

$R_{pad}$
$R_{cell}$
$R_{logic}$
$R_{peripheral}$
61
60
35
36
30
49a 48a 47a
Q
55
53
46
45
44

$R_{pad}$
$R_{cell}$
$R_{logic}$
$R_{peripheral}$
65
55b
55a
49a 48a 47a
Q
60
30
55
53
46
45
44

$R_{peripheral}$
$R_{logic}$
$R_{cell}$
$R_{pad}$
62
65
55
53
46
45
44
36
35
30
49a 48a 47a
Q $R_{peripheral}$
$R_{logic}$
$R_{cell}$
$R_{pad}$
66
65a
55
53
46
45
44
36
35
30
47a
48a
49a
Q oxygen atom
iridium atom
oxygen deficiency
before oxidation annealing
peripheral region
central region
peripheral region
49c after oxidation anneling
peripheral region
central region
peripheral region
49c $R_{peripheral}$
$R_{logic}$
$R_{cell}$
$R_{pad}$
55a
70a
55b
53
51
70
49d
49c
49a
61
49a 48a 47a
Q
35
36
30
55
53
46
45
44

R_peripheral
R_logic
R_cell
R_pad
65a
66
55
53
46
45
44
36
35
30
70
49a 48a 47a
Q

| Ave | 404.3 |
| --- | --- |
| 3σ | 29.7 |

| Ave | 404.0 |
| --- | --- |
| 3σ | 27.4 |

| Ave | 403.7 |
|---|---|
| $3\sigma$ | 28.0 |

FERROELECTRIC MEMORY AND MANUFACTURING METHOD THEREOF

CROSS-REFERENCE TO RELATED APPLICATIONS

This application is based upon prior International Patent Application No. PCT/JP2008/56335, filed on Mar. 3, 2008, the entire contents of which are incorporated herein by reference.

FIELD

It is related to a ferroelectric memory, a manufacturing method of the ferroelectric memory, and a manufacturing method of a ferroelectric capacitor.

BACKGROUND

Recently, developments have been made on ferroelectric random access memories (FeRAM) configured to retain information in ferroelectric capacitors by utilizing polarization inversion of ferroelectrics. A ferroelectric memory is drawing attention particularly because it is a non-volatile memory which does not lose retained information even after power is turned off, and is capable of achieving a high degree of integration, high-speed drive, high durability, and low power consumption.

The ferroelectric capacitor is formed by sequentially forming a lower electrode, a capacitor dielectric film made of a ferroelectric material, and an upper electrode in this order.

Among them, the upper electrode influences a ferroelectric property of the capacitor dielectric film and various types of structures for the upper electrode have been reported.

A related art is disclosed in Japanese Laid-open Patent Publication Nos. 2007-103875, 2003-133531, 2002-299576, Hei 11-40748, and International Publication Pamphlet No. WO98/06131.

SUMMARY

According to one aspect discussed herein, there is provided a ferroelectric memory including a semiconductor substrate, a transistor formed on the semiconductor substrate, and a ferroelectric capacitor formed over the transistor, wherein the ferroelectric capacitor includes a lower electrode, a ferroelectric film formed over the lower electrode, an upper electrode formed over the ferroelectric film, and a metal film formed over the upper electrode.

According to another aspect discussed herein, there is provided a method of manufacturing a ferroelectric memory, including forming a transistor on a semiconductor substrate, forming a lower electrode film over the transistor, forming a ferroelectric film over the lower electrode film, forming a first upper electrode film over the ferroelectric film, forming a second upper electrode film over the first upper electrode film, and forming a metal film over the second upper electrode film.

According to yet another aspect discussed herein, there is provided a method of manufacturing a ferroelectric capacitor, including forming a lower electrode film, forming a ferroelectric film over the lower electrode film, annealing the ferroelectric film, forming a first upper electrode film over the ferroelectric film, annealing the first upper electrode film in an oxygen-containing atmosphere, and forming a second upper electrode over the first upper electrode.

Other objects and further features of the present application will become apparent from the following detailed description when read in conjunction with the attached drawings.

DESCRIPTION OF EMBODIMENTS

Results of investigations conducted by the inventor of the present application are explained prior to description of embodiments.

(Results of Investigation 1)

Various materials have heretofore been studied as materials for an upper electrode of a ferroelectric capacitor.

Figure 1:
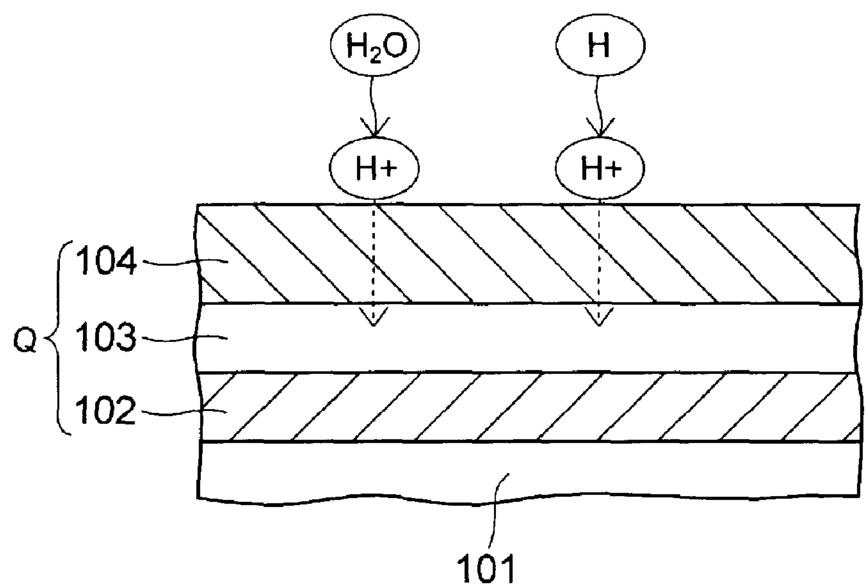
FIG. 1 is an enlarged cross-sectional view of a ferroelectric capacitor including a platinum film formed as an upper electrode.

FIG. 1 is an enlarged cross-sectional view of a ferroelectric capacitor including a platinum film formed as an upper electrode.

This ferroelectric capacitor Q is formed by sequentially forming a lower electrode 102 made of platinum, a ferroelectric film 103 made of PZT or the like, and the upper electrode 104 made of platinum in this order on a base insulating film 101 such as a silicon oxide film.

Platinum constituting the upper electrode 104 reduces moisture, hydrogen, and the like by way of a catalytic effect thereof and generates hydrogen radicals (H+). The hydrogen radicals reduce oxide ferroelectrics such as PZT constituting the ferroelectric film 103. As a consequence, oxygen deficiencies occur in the ferroelectric film 103 thereby deteriorating a ferroelectric property of the ferroelectric film 103.

Figure 2:
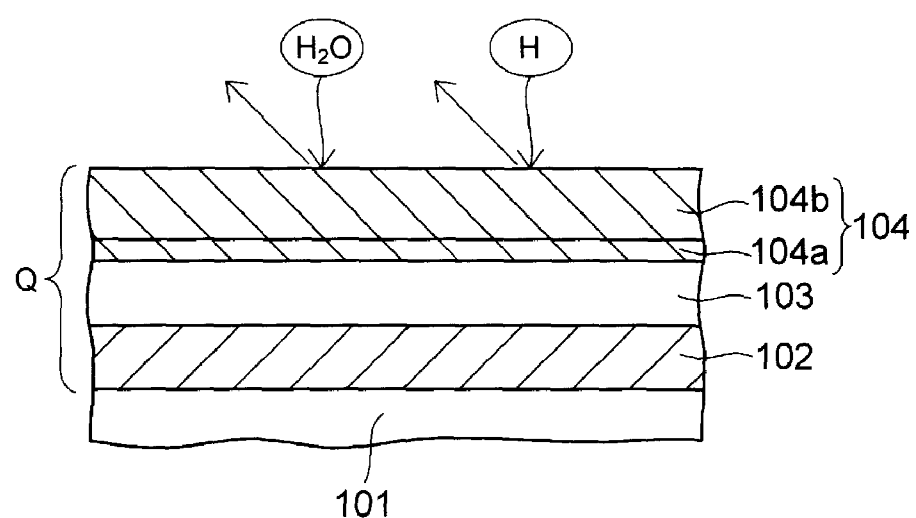
FIG. 2 is an enlarged cross-sectional view of a ferroelectric capacitor which is devised in order to suppress a catalytic effect of an upper electrode.

FIG. 2 is an enlarged cross-sectional view of a ferroelectric capacitor Q which is devised to suppress the above-mentioned catalytic effect of the upper electrode. In FIG. 2, the same constituents to as those illustrated in FIG. 1 are denoted by the same reference numerals.

In the example of FIG. 2, an upper electrode 104 includes a first upper electrode film 104*a* and a second upper electrode film 104*b*, both of which are made of iridium oxide.

Iridium oxide has a lower catalytic effect than a catalytic effect of platinum and is therefore suitable for suppressing generation of hydrogen radicals.

Figure 3:
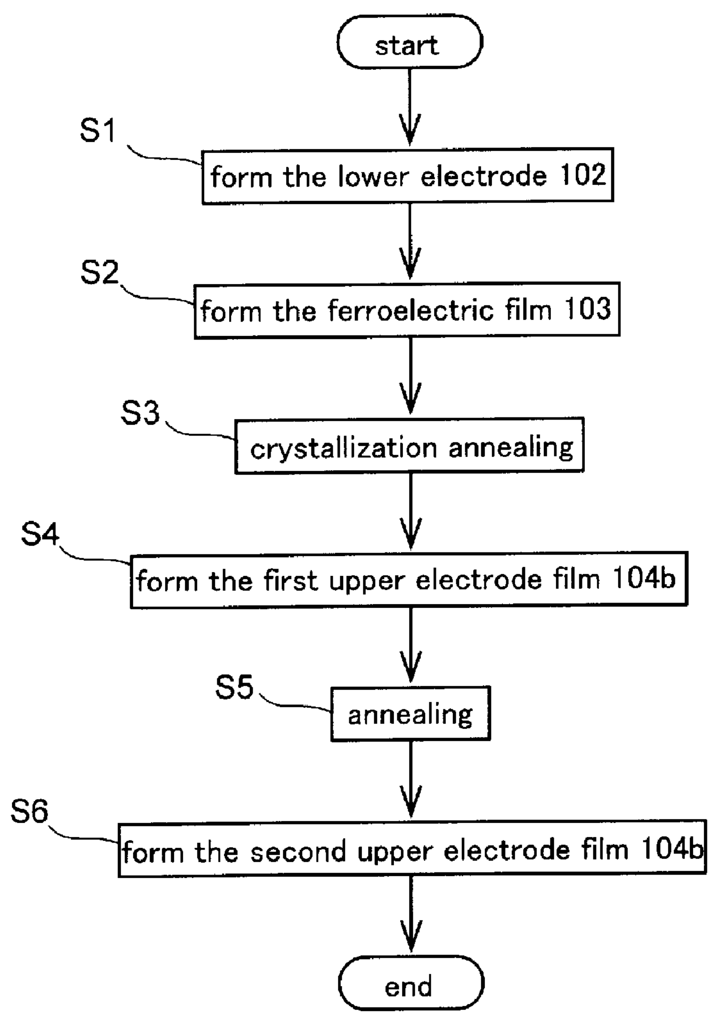
FIG. 3 is a flowchart illustrating a method of manufacturing the ferroelectric capacitor illustrated in FIG. 2.

FIG. 3 is a flowchart illustrating a method of manufacturing this ferroelectric capacitor Q.

To manufacture the ferroelectric capacitor Q, a platinum film is firstly deposited as the lower electrode 102 on the insulating film 101 by a sputtering method (step S1).

Subsequently, a PZT film is deposited on the lower electrode 102 by the sputtering method. The PZT film serves as the ferroelectric film 103 (step S2).

The ferroelectric film 103 formed by the sputtering method has not been crystallized yet and hence possesses a poor ferroelectric property.

Accordingly, in the next step, the ferroelectric film 103 is subjected to annealing so as to promote crystallization of the ferroelectric film 103 to some extent (step S3).

Next, the first upper electrode film 104*a* is deposited on the ferroelectric film 103 by a reactive sputtering method (step S4).

In this reactive sputtering method, a mixed gas of argon gas and oxygen gas is used as a sputtering gas, for example. An iridium target is bombarded by a sputtering effect of the sputtering gas and iridium granules scattered from the iridium target are oxidized by oxygen contained in a sputtering atmosphere, thereby forming an iridium oxide film.

Then, a flow rate of oxygen in the sputtering atmosphere is reduced to reduce a degree of oxidation of the first upper electrode film 104*a*, thereby forming the first upper electrode film 104*a* with a more metallic iridium oxide.

Subsequently, the ferroelectric film 103 with the first upper electrode film 104*a* formed thereon is subjected to annealing so as to completely crystallize the ferroelectric film 103 (step S5).

At this time, since the iridium oxide constituting the first upper electrode film 104*a* has the low degree of oxidation, metallic iridium oxide is thermally diffused into a crystal grain boundary of the ferroelectric film 103 easily, thereby improving the ferroelectric property of the ferroelectric film 103.

Thereafter, another iridium oxide film serving as the second upper electrode film 104*b* is deposited on the first upper electrode film 104*a* by the reactive sputtering method (step S6). This iridium oxide film is formed so as to have a higher degree of oxidation as compared to the first upper electrode film 104*a* by increasing the flow rate of oxygen in the sputtering atmosphere containing mixed gas of oxygen gas and argon gas.

The reduction effect of the second upper electrode film 104*b* can be diminished by increasing the degree of oxidation in this manner. Accordingly, it is possible to effectively suppress generation of the hydrogen radicals from moisture and the like attributed to the reduction effect of the second upper electrode film 104*b*.

In this way, when a two-layer structure is applied for the upper electrodes as illustrated in FIG. 2, it is possible to crystallize the to ferroelectric film 103 completely by subjecting the ferroelectric film 103 to annealing (step S5) after deposition of the first upper electrode film 104*a*, and also to improve the ferroelectric property of the ferroelectric film 103 by use of iridium which is thermally diffused from the first upper electrode film 104*a*.

Further, the thermal diffusion of iridium is facilitated by reducing the degree of oxidation of the first upper electrode film 104*a*, while the catalytic effect of the upper electrode 104 can be diminished by increasing the degree of oxidation of the second upper electrode film 104*b*.

However, it is revealed that following disadvantages appear in the above process. The degrees of oxidation of the respective upper electrode films 104*a* and 104*b* are controlled by adjusting the flow rates of oxygen in the sputtering atmosphere. This control method results in variation in the degree of oxidation in a substrate surface. This phenomenon is described below.

Figure 4A:
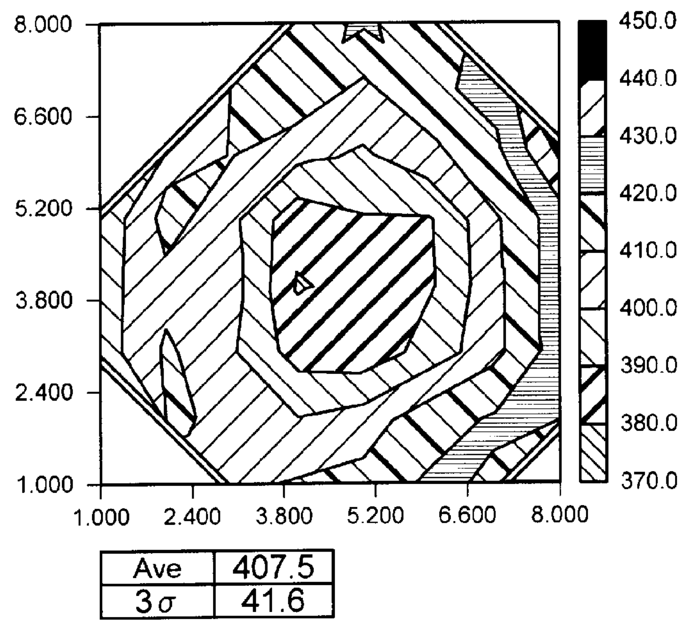
FIGS. 4A to 4C are views illustrating measurement results of sheet resistance of upper electrodes made of laminated films of iridium oxide.
Figure 4B:
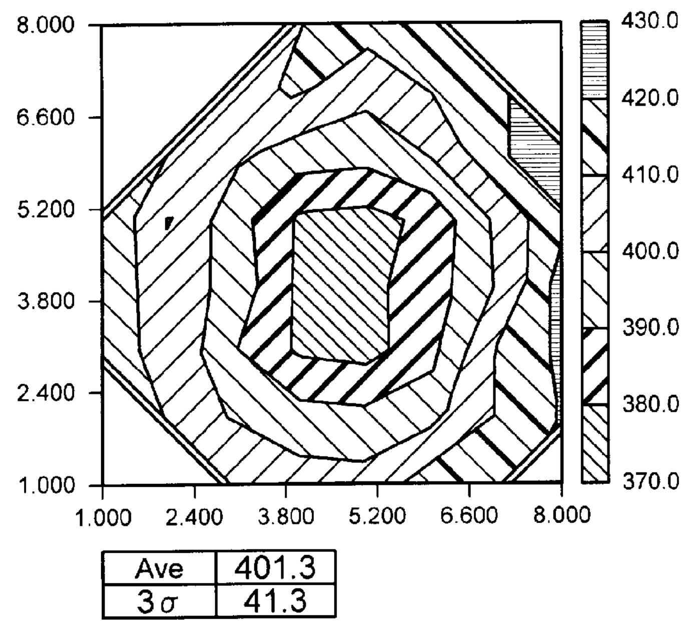
Figure 4C:
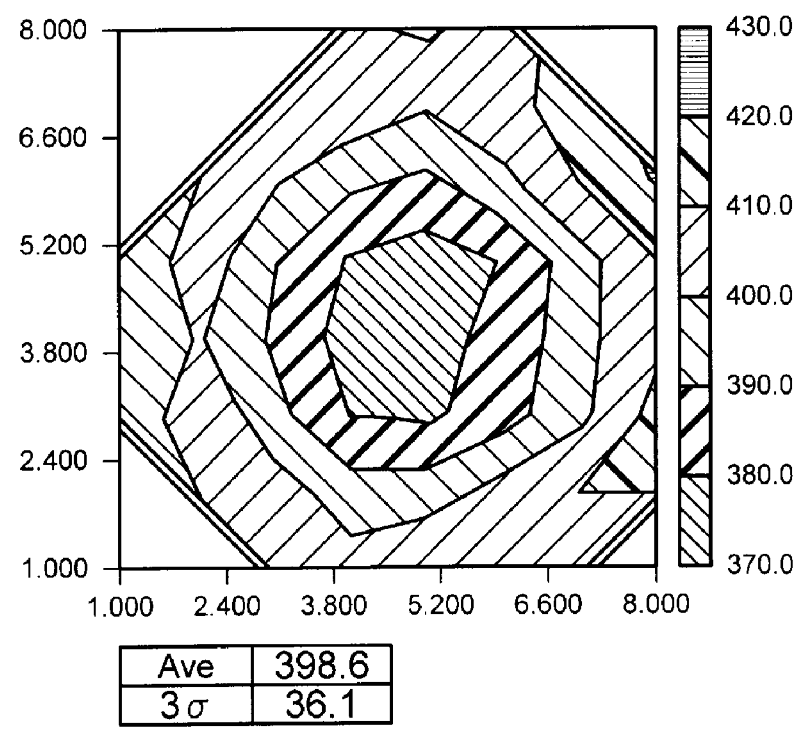

FIGS. 4A to 4C are views illustrating measurement results on three silicon substrates (wafers), respectively. Here, each measurement result is that of in-plane distribution of sheet resistance ($\Omega/60\ \mu m^2$) in the upper electrodes 104 which are formed by depositing the above-described upper electrode films 104*a* and 104*b*. Note that units of scales on the vertical axis and the horizontal axis in the drawings represent the number of chips whose length of sides is 20 mm.

As illustrated in these drawings, every silicon substrate exhibits a tendency that the sheet resistance is low at a central part of the substrate but is high at a peripheral part of the substrate.

The sheet resistance becomes lower as iridium oxide has a lower degree of oxidation and is more metallic. Therefore, the measurement results exhibit that oxygen deficiency of the iridium oxide is more significant at the central parts of the substrates.

In particular, if there is a significant oxygen deficiency in the second upper electrode film 104*b*, the second upper electrode film 104*b* becomes more metallic and the catalytic effect thereof is increased as a consequence. Accordingly, hydrogen radicals are generated from moisture and the like in an outside atmosphere due to the catalytic effect, thereby causing a problem that the ferroelectric property such as a residual polarization amount of the ferroelectric film 103 is decreased in the manufacturing process.

In the meantime, if the sheet resistance varies in the substrate surface as described above due to oxygen deficiency, a voltage value to be applied to the ferroelectric film 103 through the upper electrode 104 also varies in the substrate surface. For this reason, electric properties of the respective ferroelectric capacitors Q formed in an integrated fashion on the silicon substrate vary among the capacitors.

(Results of Investigation 2)

Ferroelectric memories are broadly classified into a planar type and a stacked type depending on their structures.

Figure 5:
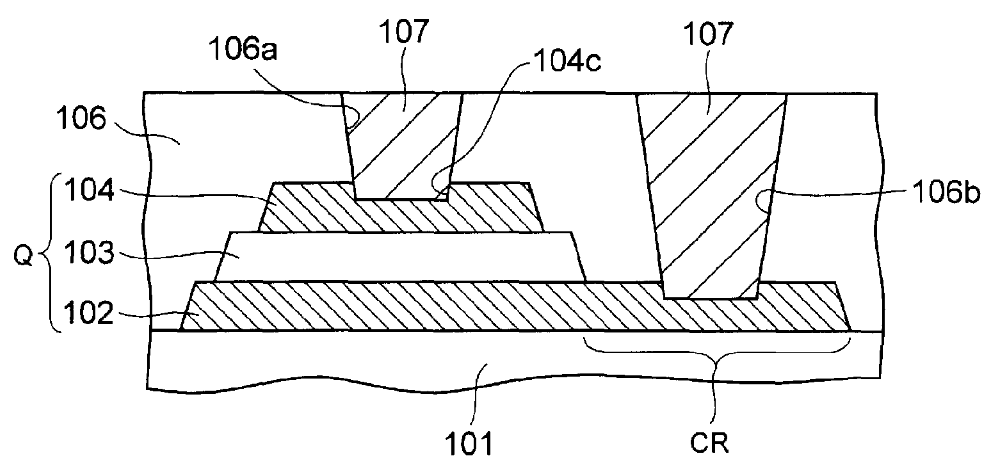
FIG. 5 is a cross-sectional view of a ferroelectric memory of a planar type.

FIG. 5 is a cross-sectional view of a ferroelectric memory of a planar type. Note that, in FIG. 5, the same constituents as those described in FIG. 2 are denoted by the same reference numerals as those in FIG. 2.

In this ferroelectric memory, an interlayer insulating film 106 is formed on the ferroelectric capacitor Q, and conductive plugs 107 electrically connected to the lower electrode 102 and the upper electrode 104, respectively, are formed in first and second holes 106*a* and 106*b* of the interlayer insulating film 106.

As illustrated in FIG. 2, the first hole 106*a* is formed over the upper electrode 104, while the second hole 106*b* is formed over a contact region CR of the lower electrode 102.

These holes 106*a* and 106*b* are simultaneously formed by dry etching the interlayer insulating film 106 while using an unillustrated resist pattern as a mask. However, when an etching amount is insufficient, the holes 106*a* and 106*b* are not completely opened, whereby contact defects may occur between the conductive plugs 107 and the respective electrodes 102 and 104. To avoid such a problem, this etching process is carried out by means of over-etching.

However, when this over-etching process is preformed, the upper electrode 104 below the first hole 106*a* is etched, thereby forming a concave portion 104*c*.

An etching rate of the dry etching process usually varies in the substrate surface. Hence the depth of the concave portion 104*c* also varies in the substrate surface.

This variation causes variation in the volume of the upper electrode 104 in the substrate surface. In addition, the resistance value of the upper electrode 104 determined based on its volume also varies in the substrate surface. As a consequence, the electric property of the ferroelectric capacitor Q varies in the substrate surface.

Moreover, due to variation in the etching atmosphere, the depth of the concave portion 104*a* may also vary for each substrate or each lot. Hence there is a risk of variation in the electric properties of the ferroelectric capacitors Q depending on the substrates or the lots.

In particular, when opening the first and second holes 106*a* and 106*b* simultaneously by etching as described above, an etching period is adjusted so as to open the deeper second hole 106*b*. Therefore, the upper electrode 104 located below the shallower first hole 106*b* is exposed to the etching atmosphere for a long period, and formation of the concave portion 104*c* becomes more prominent.

Furthermore, an investigation revealed that a fatigue property of the ferroelectric capacitor Q is apt to be deteriorated as a result of formation of the concave portion 104*c* in the upper electrode 104.

Figure 6:
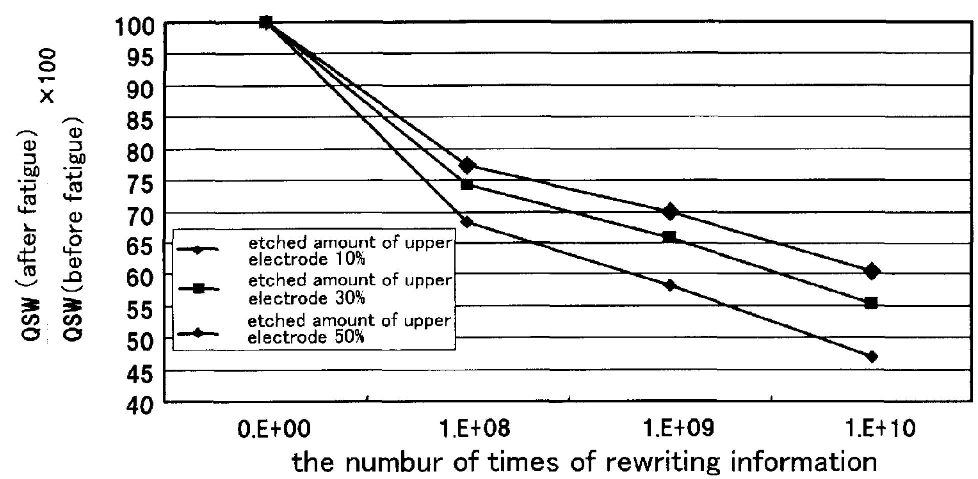
FIG. 6 is a graph illustrating behaviors of fatigue properties of ferroelectric capacitors, which tend to be deteriorated because of concave portions formed on upper electrodes.

FIG. 6 is a graph illustrating a result of the investigation.

The horizontal axis of this graph indicates the number of times of rewriting information in the capacitor Q. Meanwhile, the vertical axis indicates a ratio (fatigue property) between an amount of residual polarization charge (Qsw) of the capacitor dielectric film 103 after rewriting information (after fatigue) for a predetermined number of times and an amount of residual polarization charge thereof before rewriting the information (before fatigue).

Meanwhile, "etched amount of upper electrode X %" means that the concave portion 104*c* is formed in the depth equivalent to X % of a film thickness of the upper electrode 104.

Note that this investigation was conducted on a ferroelectric capacitor Q formed in a peripheral region of a silicon substrate out of ferroelectric capacitors Q integrally formed on the substrate.

As illustrated in FIG. 6, as the etched amount of the upper electrode becomes higher, the deterioration in the fatigue property which occurs along with the increase in the number of times of rewriting becomes more significant.

In order to avoid this problem due to the concave portion 104*c*, it is also conceivable to form the holes 106*a* and 106*b* separately as described below.

Figure 7:
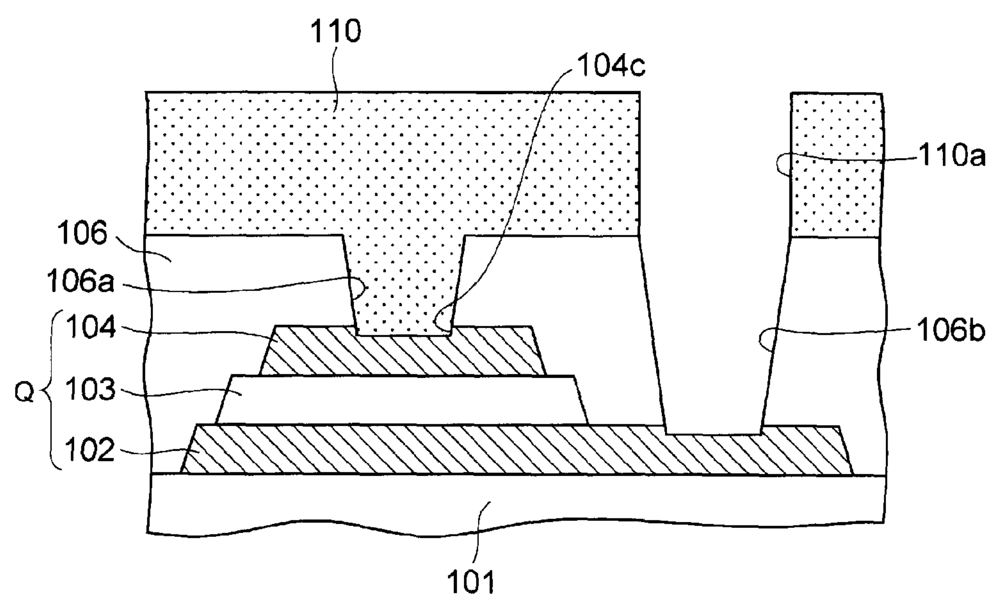
FIG. 7 is a cross-sectional view illustrating a case of separately providing holes to be formed respectively on an upper electrode and a lower electrode of a ferroelectric capacitor Q.

FIG. 7 is a cross-sectional view illustrating the case of separately forming the holes 106*a* and 106*b*.

In this case, the first hole 106*a* is formed on the upper electrode 104 and then a resist pattern 110 is formed on the interlayer insulating film 106. Then, the second hole 106*b* is formed by etching the interlayer insulating film 106 through a window 110*a* in the resist pattern 110.

Here, the etching amount needs to be adjusted to reach only the depth required for the first hole 106*a* when forming the first hole 106*a* on the upper electrode 104 by etching. In other words, the etching amount does not have to be adjusted to reach the depth required for the second hole 106*b* in this step. Accordingly, it is possible to minimize an over-etching amount in the upper electrode 104 and reduce the depth of the concave portion 104*c*.

However, there is the following concern. The resist pattern 110 provided for forming the second hole 106*b* is formed in the first hole 106*a* in this case. Accordingly, the resist residue may be left in the first hole 106*a* due to imperfect removal of the resist pattern 110 by means of ashing. This may cause a contact defect of the conductive plug 107 (see FIG. 5) over the upper electrode 104. Moreover, when the ashing process is performed for a long period by use of oxygen plasma so as not to leave the resist residue, there is a concern of damaging the ferroelectric film 103 with the oxygen plasma.

In view of the results of the investigations described above, the inventor of the present invention comes up with the following embodiments.

First Embodiment

A ferroelectric memory according to a first embodiment is described together with a manufacturing process thereof.

Figure 8A:
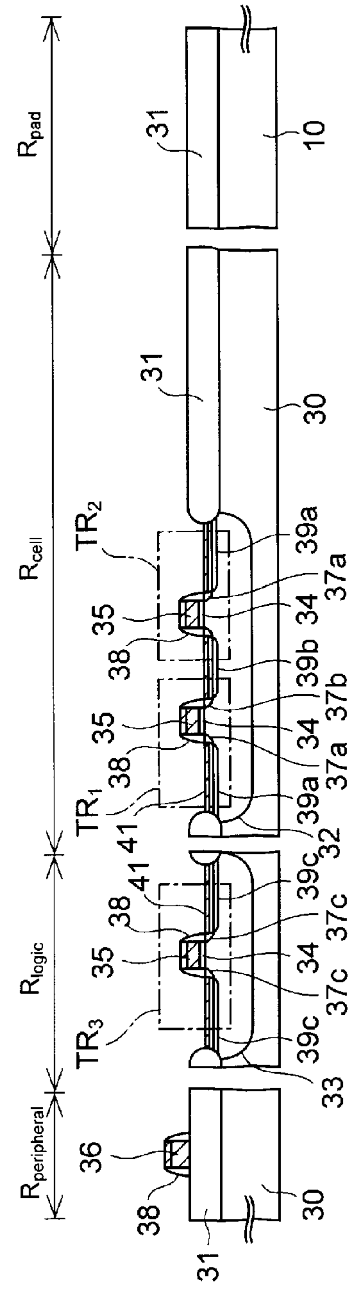
FIGS. 8A to 8W are cross-sectional views in the process of manufacturing a ferroelectric memory according to a first embodiment of the present invention.
Figure 8B:
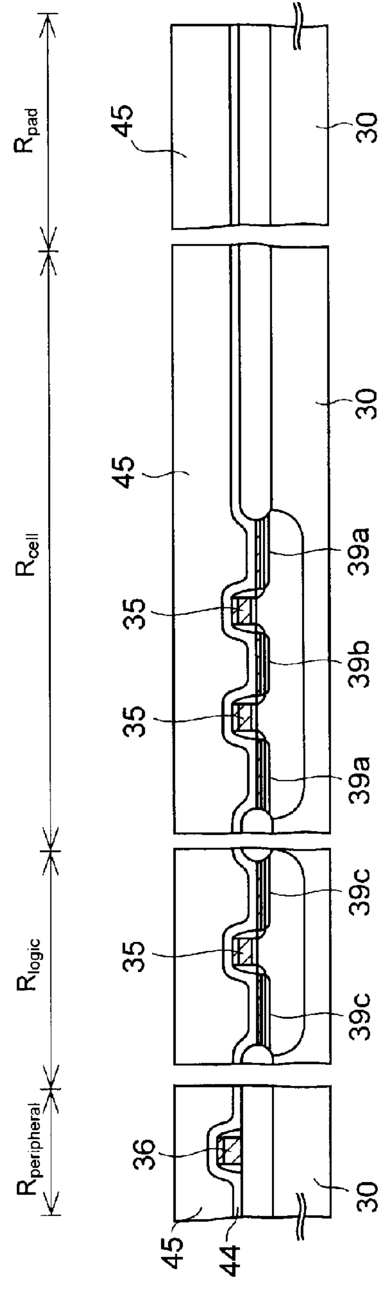
Figure 8C:
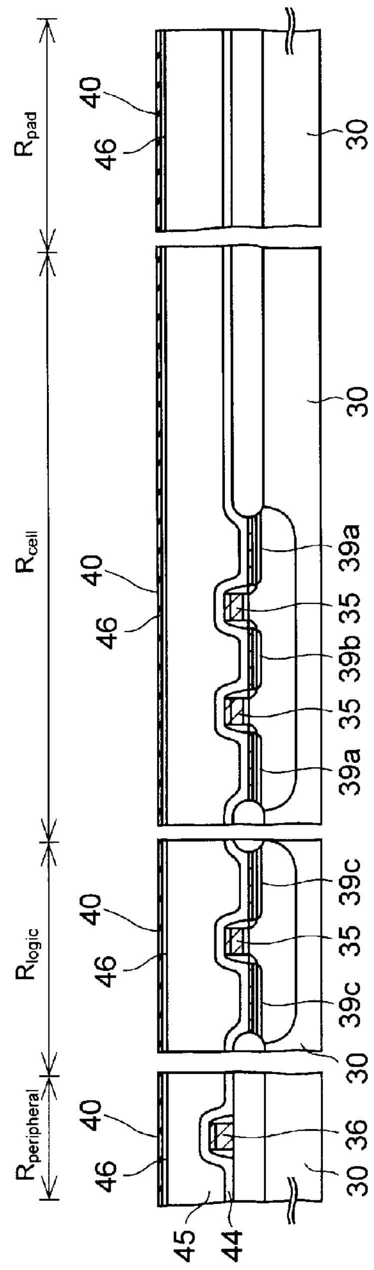
Figure 8D:
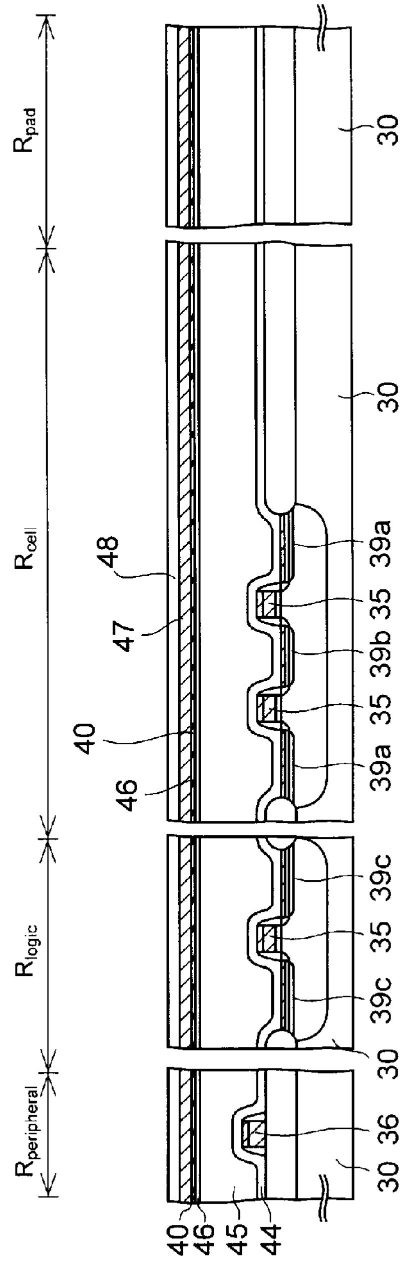
Figure 8E:
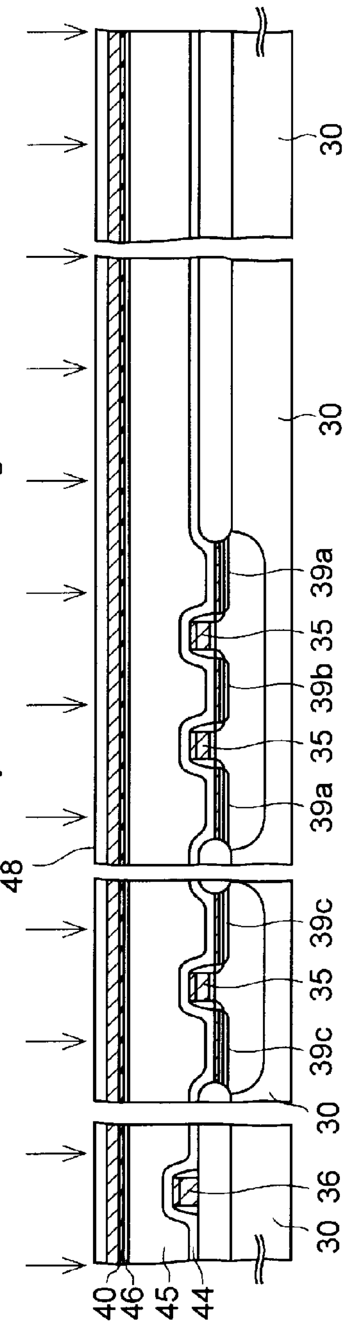
Figure 8F:
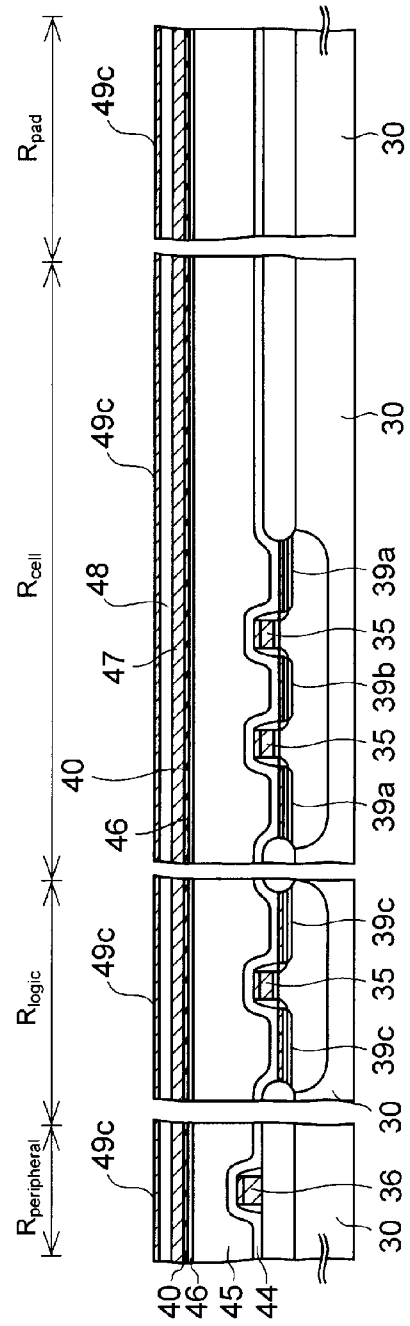
Figure 8G:
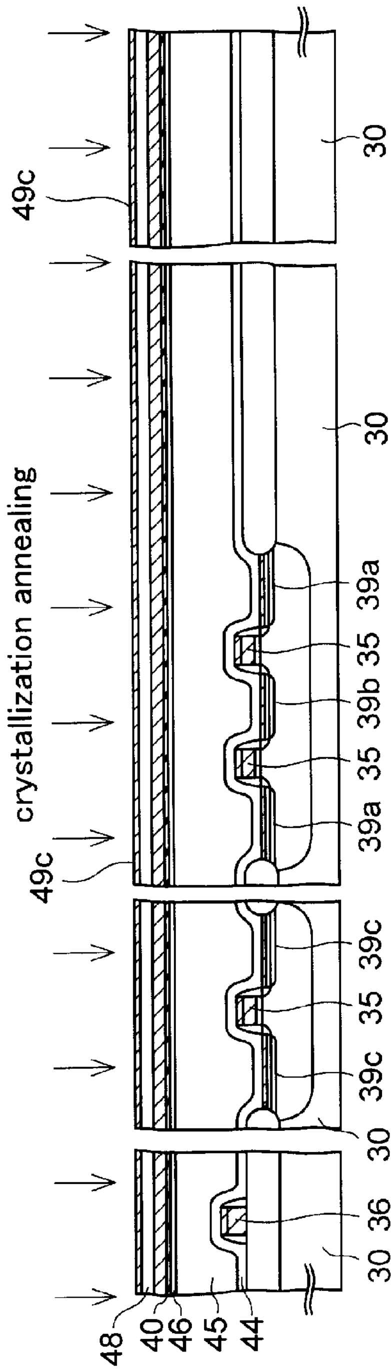
Figure 8H:
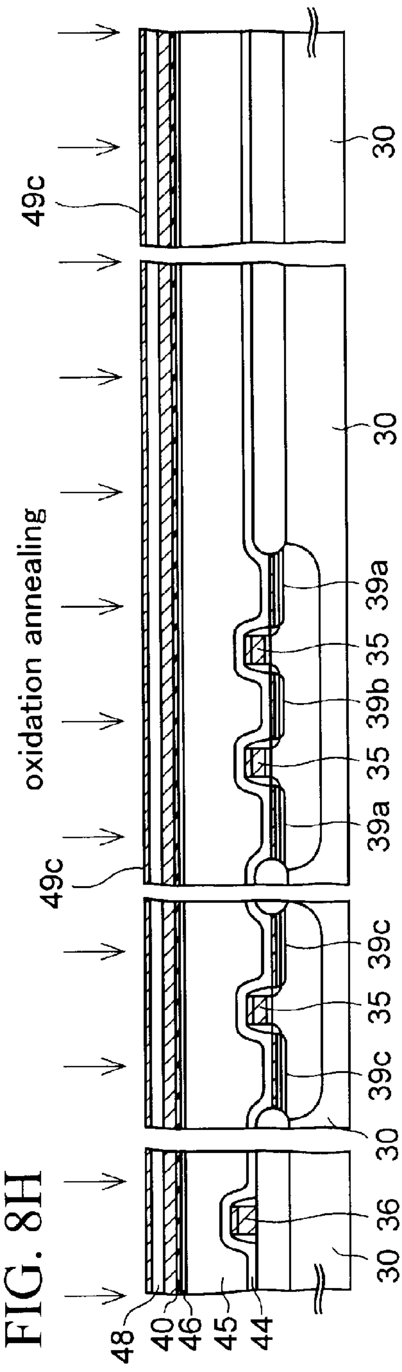
Figure 8I:
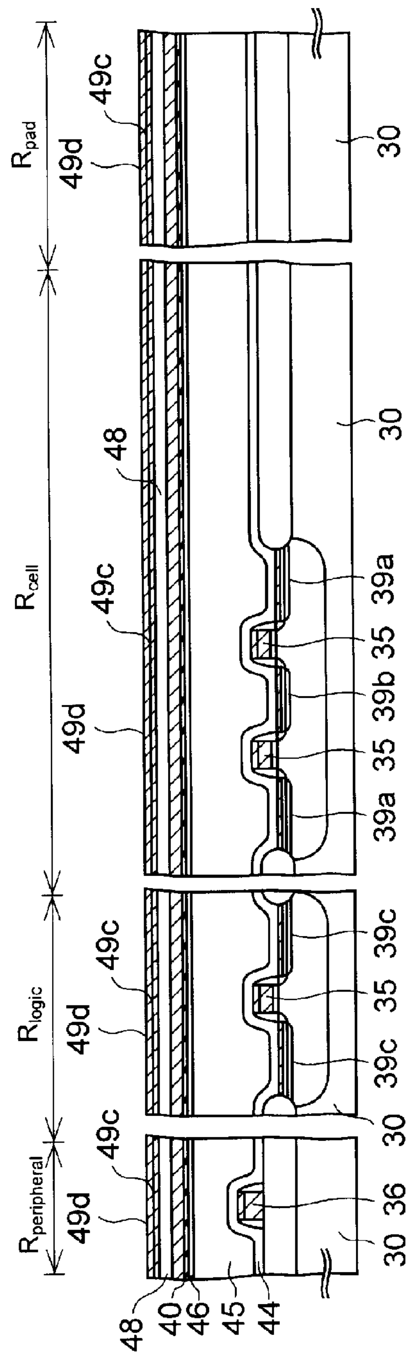
Figure 8J:
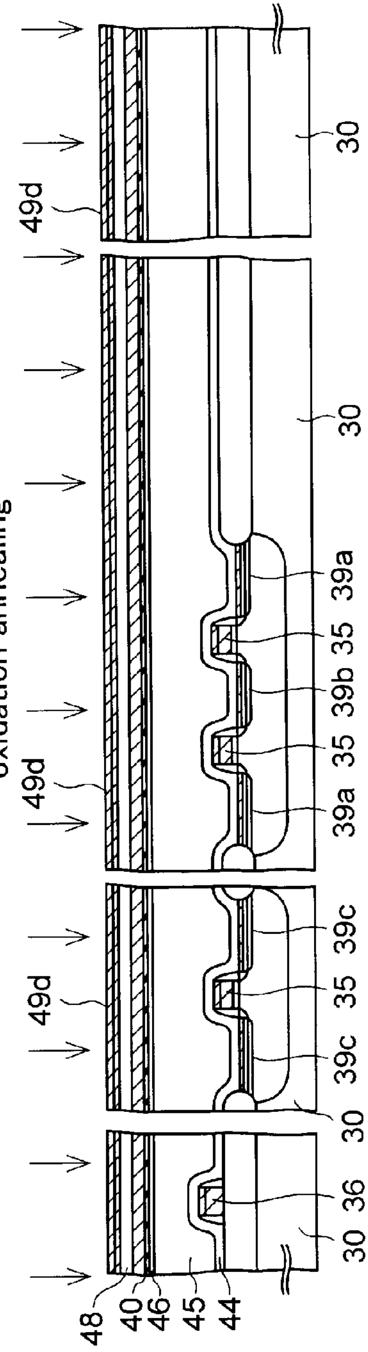
Figure 8K:
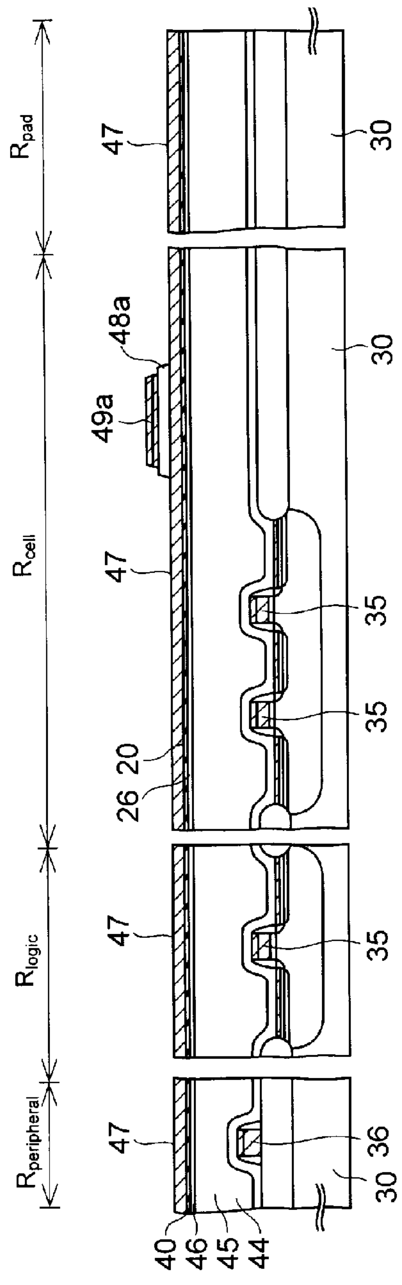
Figure 8L:
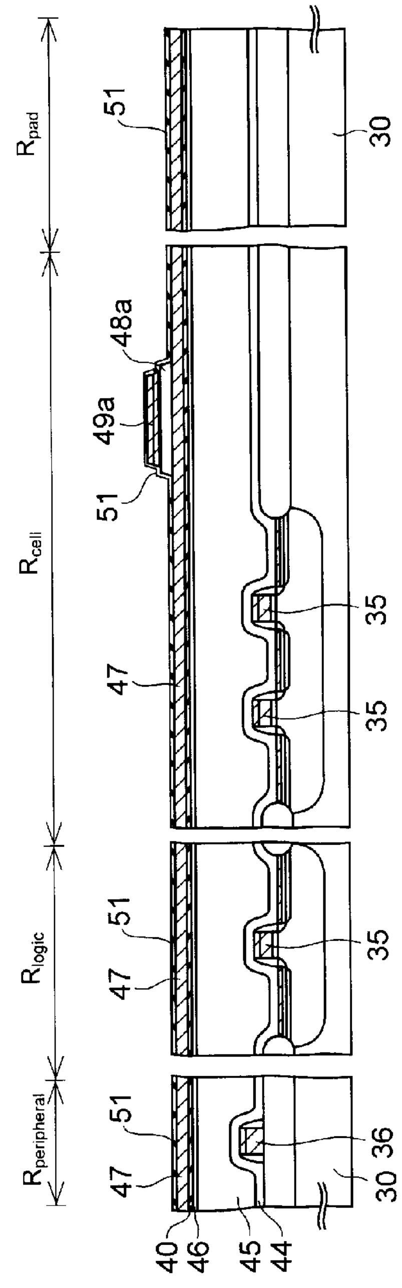
Figure 8M:
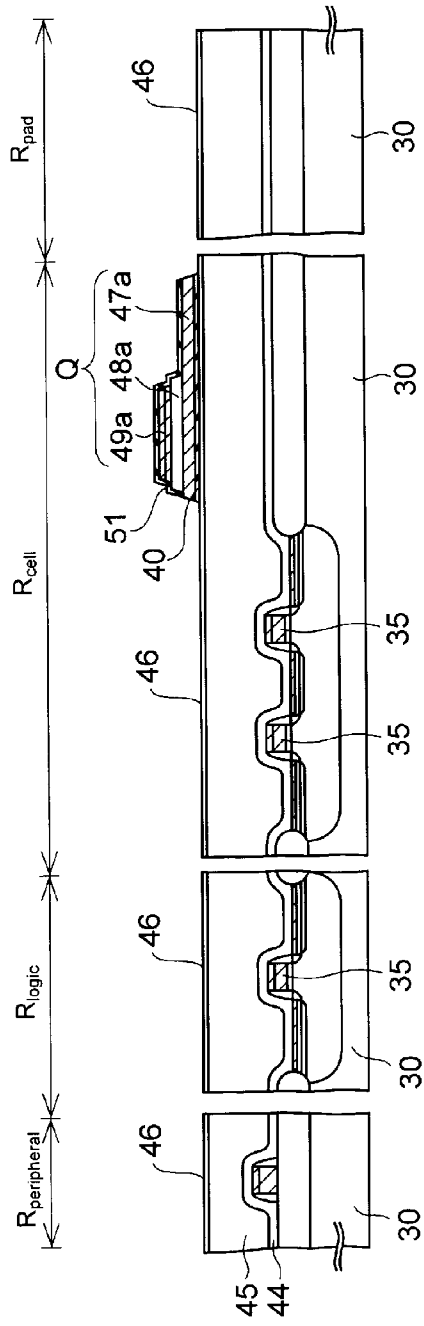
Figure 8N:
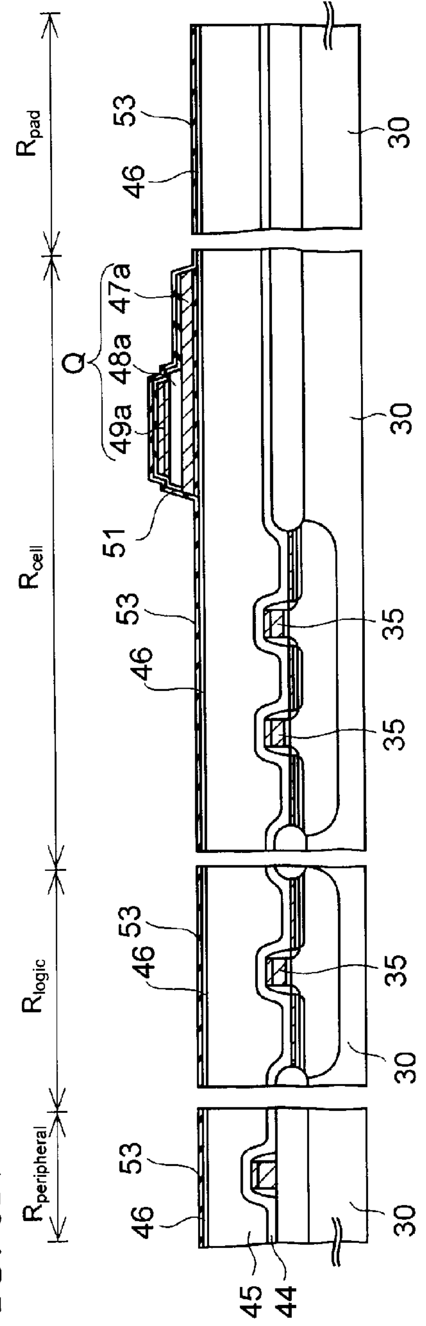
Figure 80:
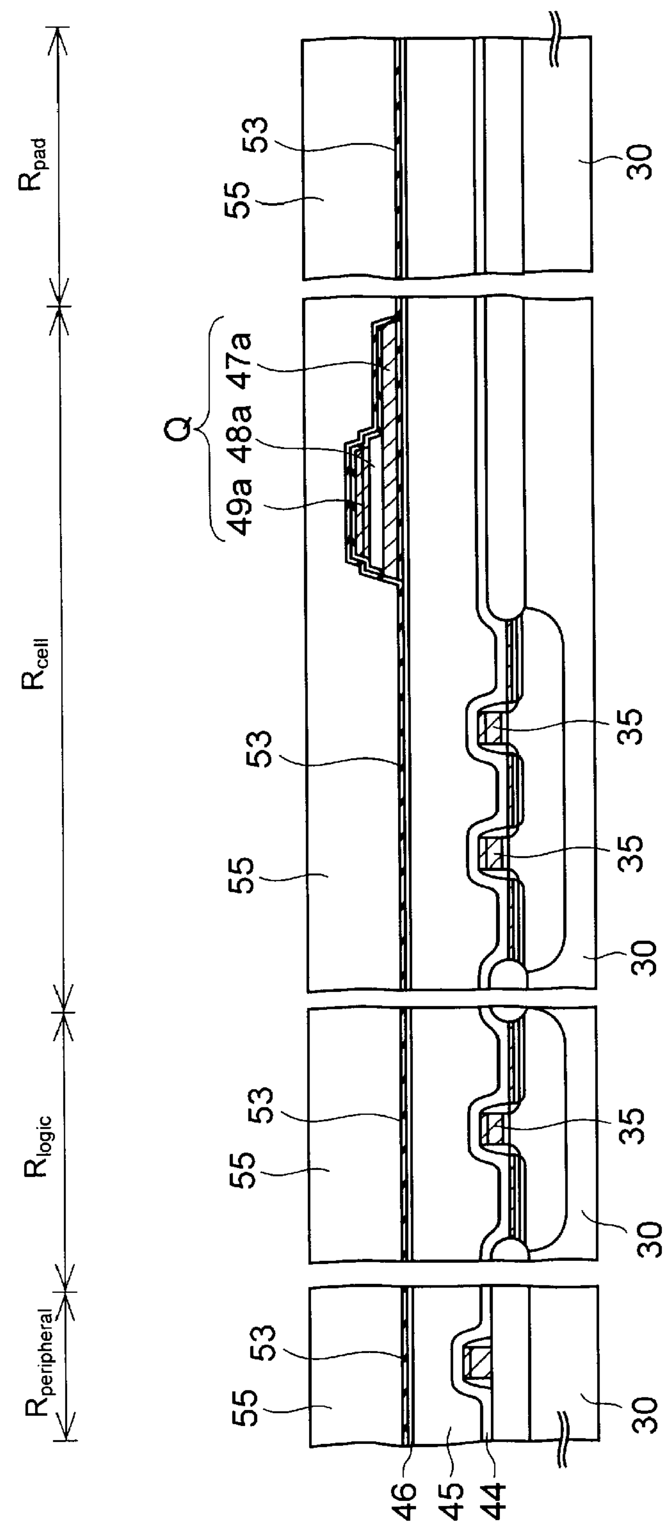
Figure 8P:
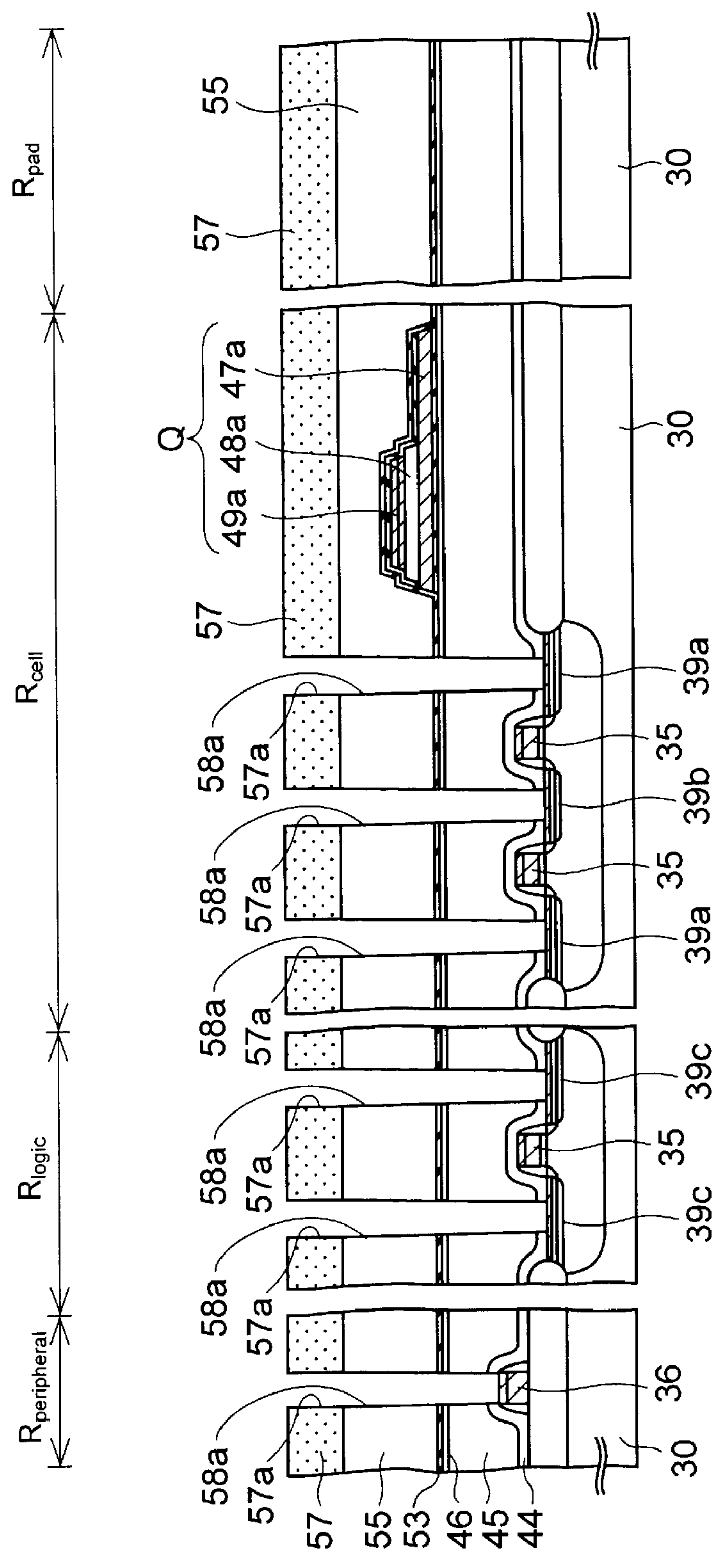
Figure 8Q:
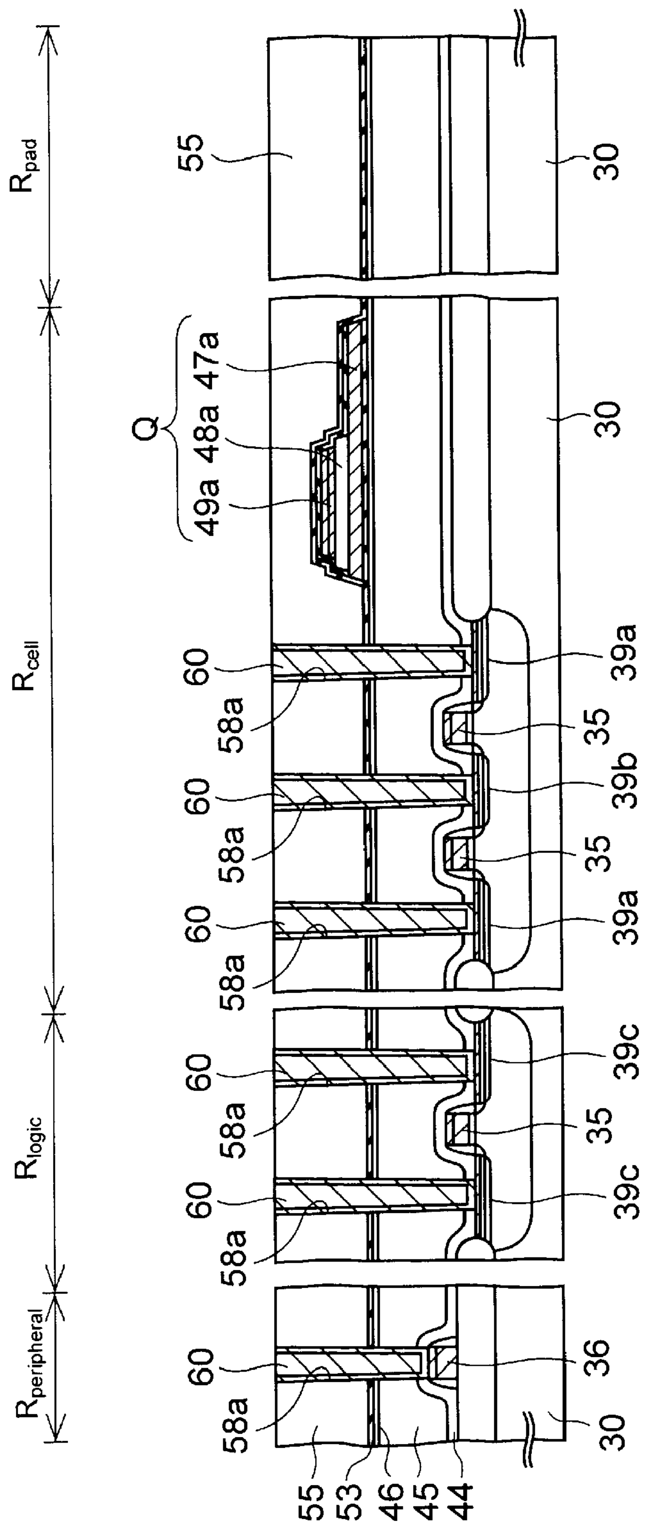
Figure 8R:
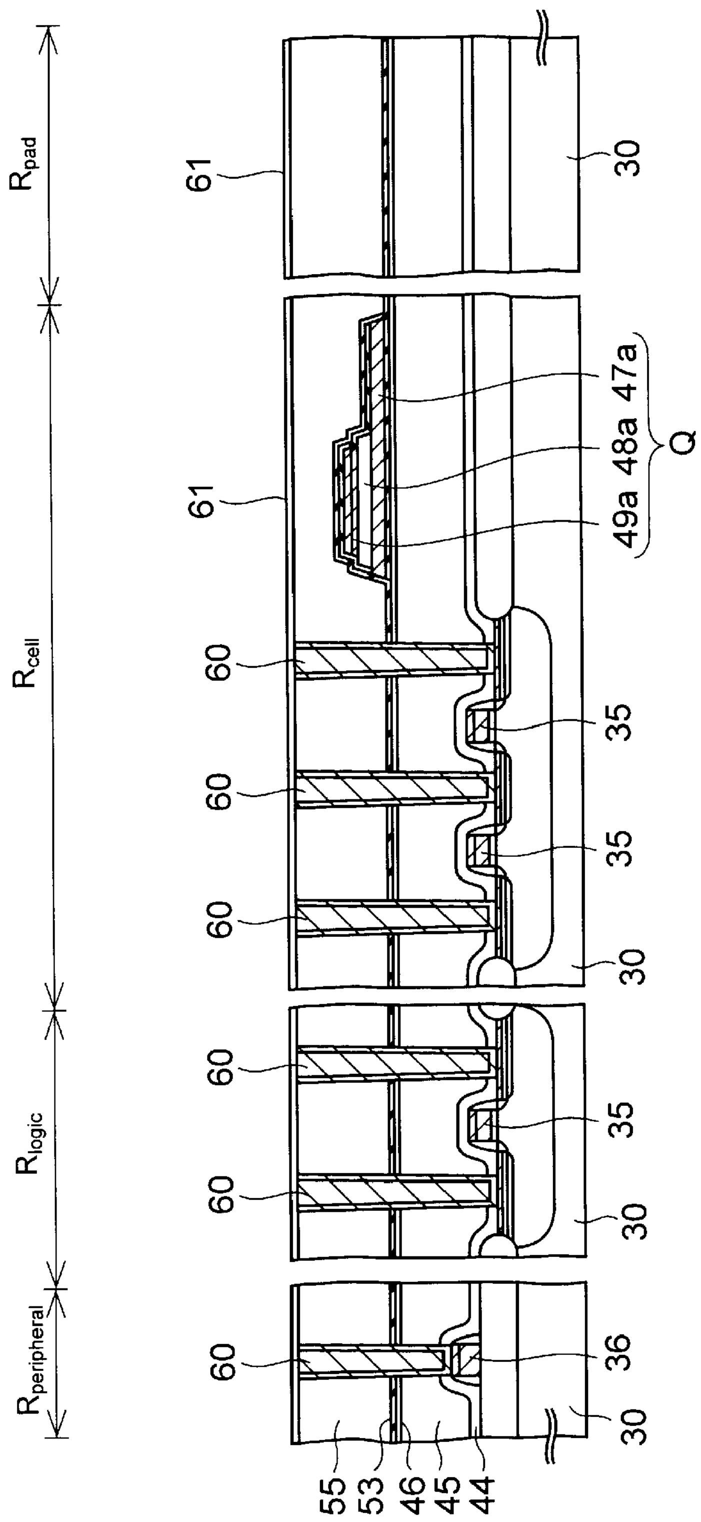
Figure 8S:
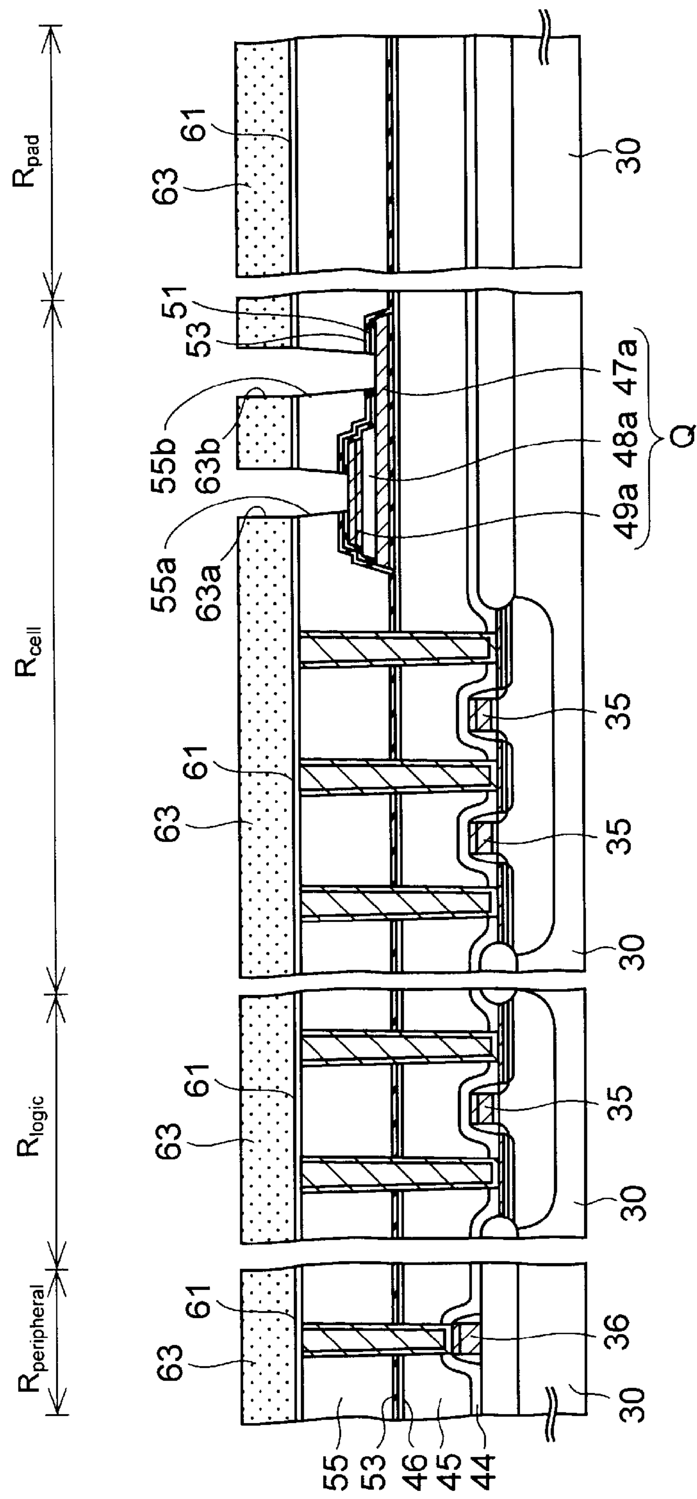
Figure 8T:
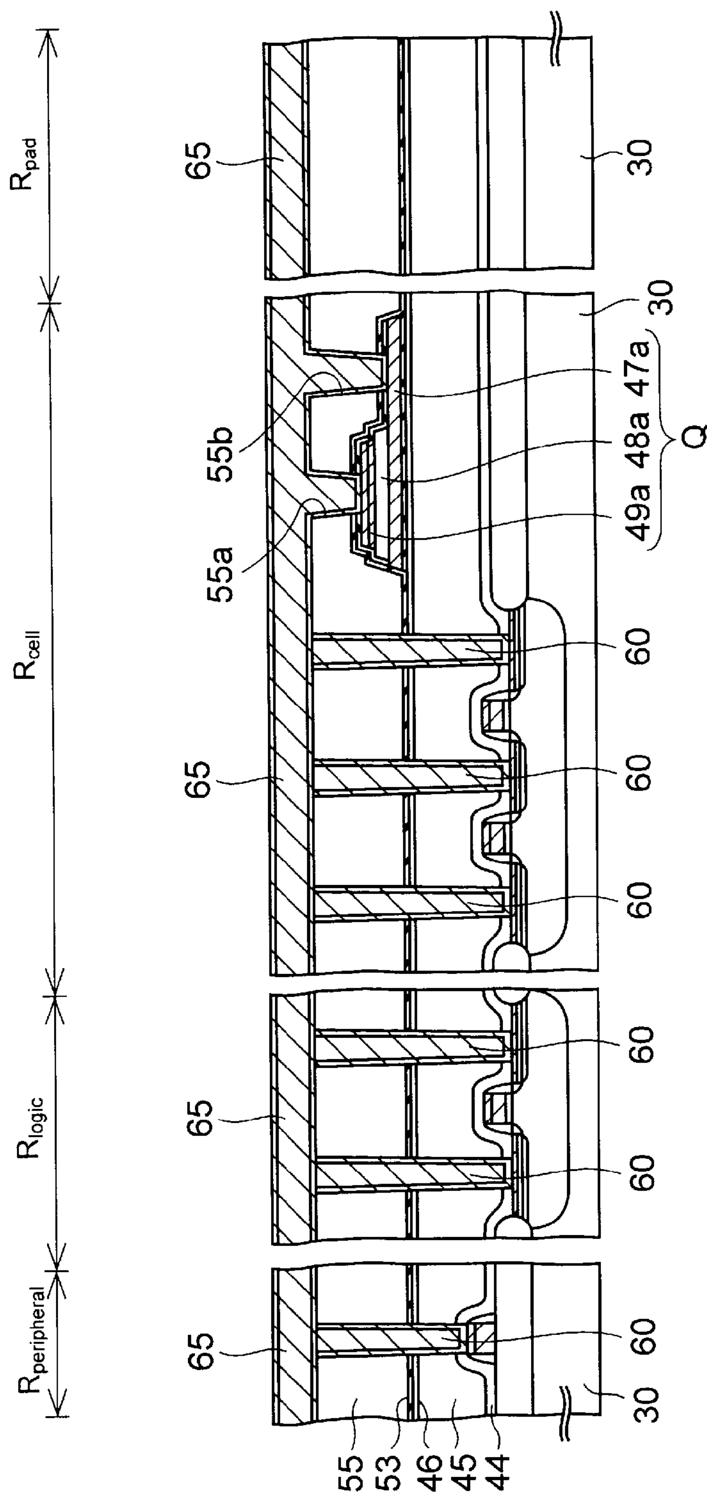
Figure 8U:
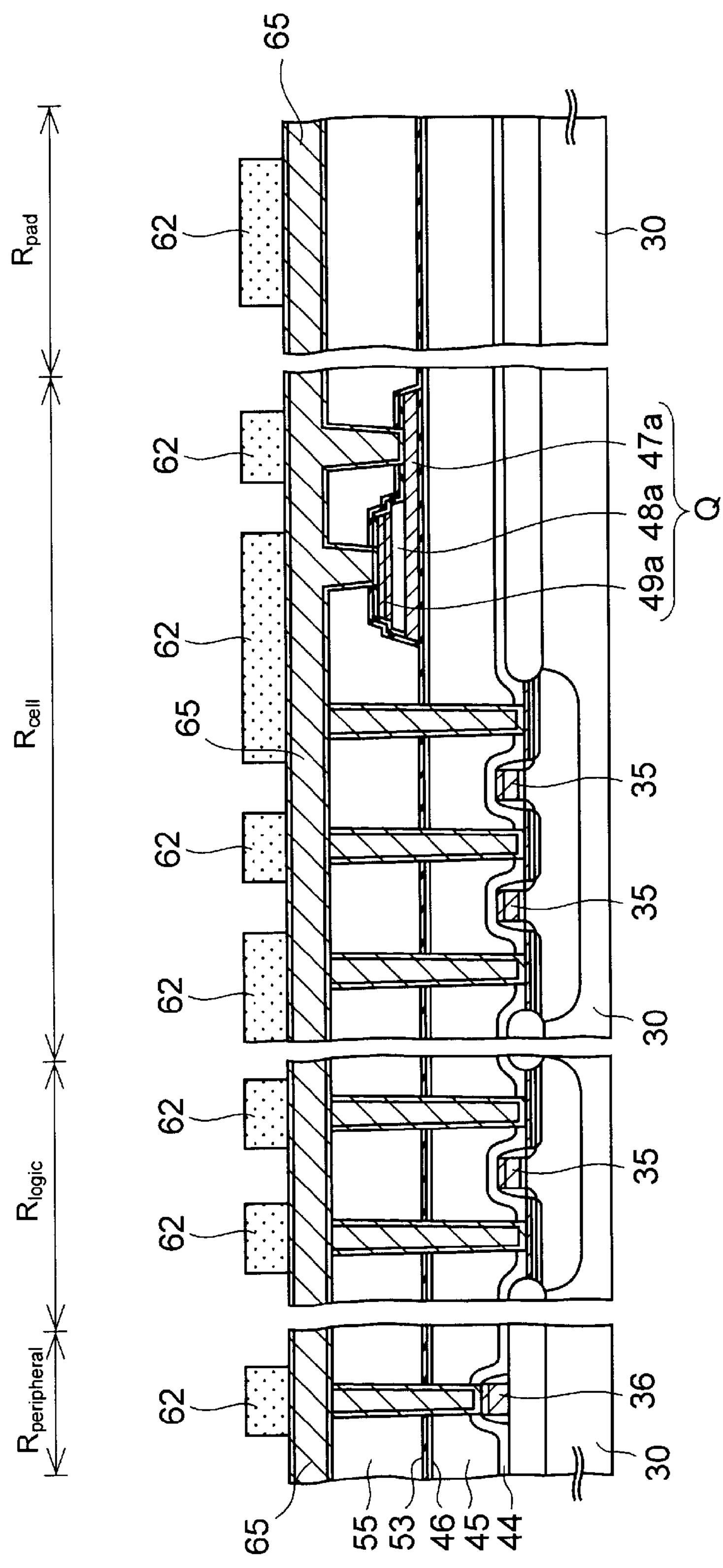
Figure 8V:
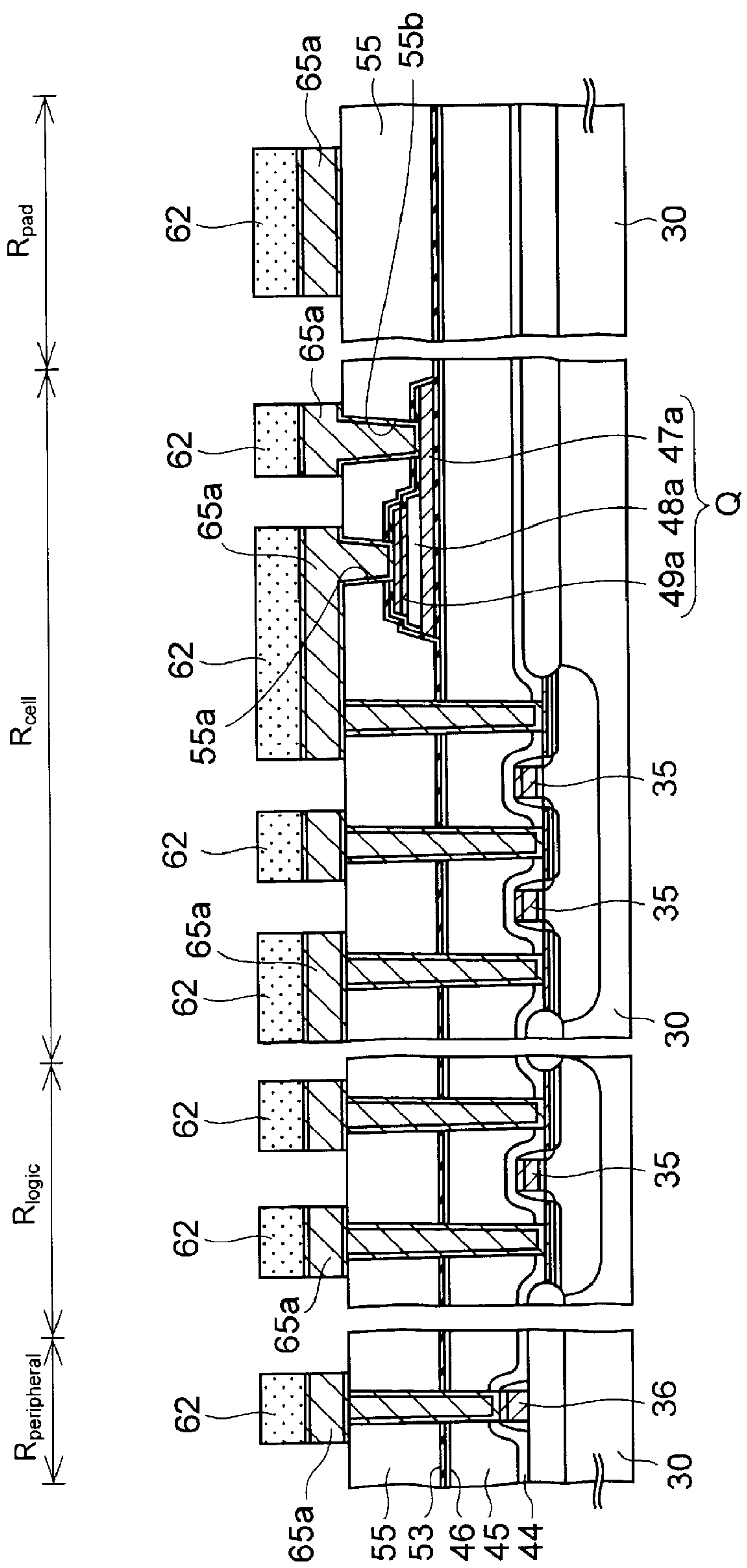
Figure 8W:
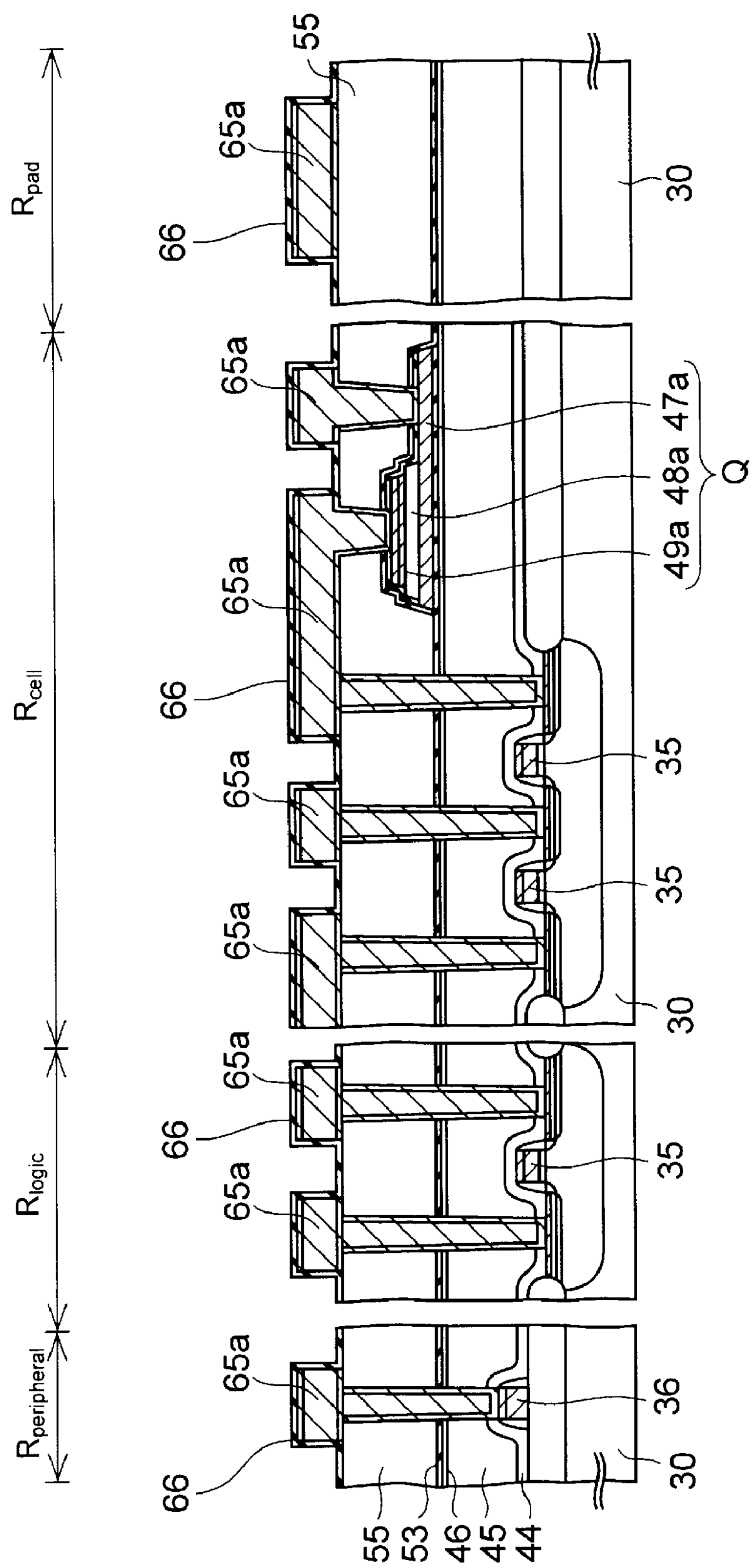

FIGS. 8A to 8W are cross-sectional views in the process of manufacturing the ferroelectric memory of this embodiment. Each of these drawings includes a peripheral circuit region $R_{peripheral}$, a logic circuit region $R_{logic}$, a cell region $R_{cell}$, and a pad region $R_{pad}$ in a single semiconductor chip.

This ferroelectric memory is a FeRAM of a planar type, which is manufactured as follows.

First, the steps for obtaining a cross-sectional structure illustrated in FIG. 8A are described.

An element isolation insulating film 31 is formed by thermally oxidizing a surface of a silicon (semiconductor) substrate 30 of either an n-type or a p-type, and active regions of transistors are defined by the element isolation insulating film 31. A film thickness of the element isolation insulating film 31 is about 200 nm from an upper surface of the silicon substrate 30, for example. In stead of such an element isolation structure of LOCOS, STI (shallow trench isolation) may be employed.

Next, a p-type impurity such as boron is introduced into the active regions of the silicon substrate 30 to form first and second p wells 32 and 33. Then, a thermal oxide film serving as a gate insulating film 34 is formed with a thickness of about 6 nm to 7 nm by thermally oxidizing a surface of each active region.

Subsequently, an amorphous silicon film with a thickness of about 50 nm and a tungsten silicide film with a thickness of about 150 nm are sequentially formed on an entire upper surface of the silicon substrate 30. Here, a polycrystalline silicon film may be formed instead of the amorphous silicon film. Thereafter, these films are patterned by photolithography to form gate electrodes 35 on the silicon substrate 30 at positions in the logic circuit region $R_{logic}$ and the cell region $R_{cell}$, and also to form a wiring 36 on the element isolation insulating film 31 at a position in the peripheral circuit region $R_{peripheral}$.

A gate length of each gate electrode 35 is approximately 360 μm, for example.

Further, phosphorus serving as an n-type impurity is introduced into portions of the silicon substrate 30 at the sides of the gate electrodes 35 by ion implantation while using the gate electrodes 35 as a mask, thereby forming first to third source/drain extensions 37*a* to 37*c*.

Thereafter, an insulating film is formed on the entire upper surface of the silicon substrate 30 and then the insulating film is etched back and left on sides of the gate electrodes 35 and the wiring 36 as insulative side walls 38. The insulating film is, for example, a silicon oxide film formed with a thickness of 45 nm by a CVD method.

Subsequently, an n-type impurity such as arsenic is ion-implanted into the silicon substrate 30 while using the insulative side walls 38 and the gate electrodes 35 as a mask, thereby forming first to third source/drain regions 39*a* to 39*c* in the silicon substrate 30 at the sides of the gate electrodes 35.

Further, a refractory metal film such as a cobalt film is formed on the entire upper surface of the silicon substrate 30 by the sputtering method. Then, a refractory metal silicide layer 41 such as a cobalt silicide layer is formed on the silicon substrate 30 in the first to third source/drain regions 39*a* to 39*c* by heating the refractory metal film to cause a reaction with silicon. Hence, resistance of each of the source/drain regions 39*a* to 39*c* is reduced by the refractory metal silicide layer 41. Note that the above-described refractory metal silicide layer is also formed on surfaces of the gate electrodes 35 and the wiring 36.

Thereafter, the unreacted refractory metal layer on the element isolation insulating film 31 and the like is removed by wet etching.

In the steps described so far, first to third MOS transistors $TR_1$ to $TR_3$ each formed of the gate insulating film 34, the gate electrodes 35, the first to third source/drain regions 39*a* to 39*c*, and the like are provided in the cell region $R_{cell}$ and the logic circuit region $R_{logic}$ of the silicon substrate 30.

Next, as illustrated in FIG. 8B, a silicon oxy-nitride (SiON) film is formed with a thickness of about 200 nm on the entire upper surface of the silicon substrate 30 by a plasma CVD method. This film serves as a cover insulating film 44.

Further, a silicon oxide film serving as a first interlayer insulating film 45 is formed with a thickness of about 600 nm on this cover insulating film 44 by the plasma CVD method using a mixed gas of TEOS gas and oxygen gas. Thereafter, an upper surface of the first interlayer insulating film 45 is polished by a chemical mechanical polishing (CMP) method in order to planarize the upper surface. A polishing amount is set to about 200 nm, for example.

Next, as illustrated in FIG. 8C, another silicon oxide film is formed again with a thickness of about 100 nm on the first interlayer insulating film 45 by the plasma CVD method using TEOS gas. This silicon oxide film serves as a cap insulating film 46.

Then, annealing is preformed for about 30 minutes at a substrate temperature of about 650° C. in a nitrogen atmosphere as dehydration processing for these insulating films 45 and 46. Thereafter, an alumina film 40 is formed with a thickness of about 20 nm on the cap insulating film 46 by the sputtering method.

Thereafter, this alumina film 40 is subjected to rapid thermal annealing (RTA) in an oxygen atmosphere while setting the substrate temperature to 650° C. and a processing period to 60 seconds.

By forming the cap insulating film 46 in advance before the formation of the alumina film 40 as described above, micro scratches on the upper surface of the first interlayer insulating film 45 caused by contact with a polishing pad in the course of the CMP are buried with the cap insulating film 46, whereby the alumina film 40 is formed on the upper surface of the cap insulating film 46 with excellent planarity.

Next, the steps for obtaining a cross-sectional structure illustrated in FIG. 8D are described.

First, a platinum film serving as a lower electrode film 47 is formed with a thickness of about 155 nm on the alumina film 40.

Moreover, a PZT film is formed with a thickness in a range from 150 nm to 200 nm on the lower electrode film 47 by the sputtering method. This PZT film serves as a ferroelectric film 48.

In addition to the sputtering method, a sol-gel method is also applicable as the method for depositing the ferroelectric film 48. Further, the material of the ferroelectric film 48 is not limited to PZT. The ferroelectric film 48 may also be made of: Bi-layered structure compounds such as SBT ($SrBi_2Ta_2O_9$), $SrBi_2$ $(Ta_xNb_{1-x})_2O_9$ or $Bi_4Ti_2O_{12}$; PLZT ($Pb_{1-x}La_xZr_{1-y}Ti_yO_3$) which is PZT doped with lanthanum; or other metal oxide ferroelectrics.

By forming the lower electrode film 47 on the alumina film 40 as described above, orientation of platinum constituting the lower electrode film 47 is improved as compared to the case of directly forming the lower electrode film 47 on the cap insulating film 46 by omitting the alumina film 40. By an action of the improved orientation of the lower electrode film 47, orientation of PZT constituting the ferroelectric film 48 is aligned and a ferroelectric property of the ferroelectric film 48 is improved.

Incidentally, PZT formed by the sputtering method is hardly crystallized immediately after being deposited and therefore has a poor ferroelectric property.

Accordingly, in the next step, as illustrated in FIG. 8E, the RTA is performed as crystallization annealing to crystallize PZT constituting the ferroelectric film 48 to some extent. The RTA is preformed for a period of about 90 seconds at a substrate temperature of about 563° C. in an oxygen-containing atmosphere in which a flow rate of oxygen is 0.055 litter/min and a flow rate of argon gas is 1.95 litter/min.

Here, it is not always necessary to completely crystallize PZT in this step due to a reason to be described later. Rather, it is preferable to leave the crystallization incomplete and to form gaps in a PZT crystal grain boundary. For this reason, this crystallization annealing is preferably carried out at a low temperature around 563° C. as described above.

Next, as illustrated in FIG. 8F, an iridium oxide film (a first oxide film) is formed with a thickness of about 50 nm on the above-described ferroelectric film 48 by a reactive sputtering method. This film serves as a first upper electrode film 49*c*.

In the reactive sputtering method, the mixed gas of oxygen and argon is used as the sputtering gas and an iridium target is also used. Then, iridium granules sputtered from the iridium target are oxidized by oxygen contained in the sputtering gas, and thereby the iridium oxide film is deposited.

The first upper electrode film 49*c* made of such iridium oxide film is formed to thermally diffuse iridium in the film into the ferroelectric film 48 by annealing performed in a subsequent step. Accordingly, it is preferable to form the first upper electrode film 49*c* by metallic iridium oxide having a low degree of oxidation so as to facilitate the thermal diffusion.

The degree of oxidation is controllable by adjusting a flow rate ratio of the oxygen gas in the sputtering gas. Specifically, the degree of oxidation of iridium oxide can be lowered by setting the flow rate ratio as small as possible.

For example, when the flow rate of the argon gas is 100 sccm, the flow rate of the oxygen gas may be set to or below 53 sccm.

Subsequently, as illustrated in FIG. 8G, the ferroelectric film 48 having the first upper electrode film 49*c* formed thereon is subjected to crystallization annealing again.

The PZT constituting the ferroelectric film 48 is almost completely crystallized by this crystallization annealing. Moreover, since the crystallization of PZT is intentionally rendered incomplete in the crystallization annealing illustrated in FIG. 8E so as to form the gaps in the crystal grain boundary of PZT. Accordingly, iridium contained in the first upper electrode film 49*c* is diffused into the ferroelectric film 48 by the crystallization annealing in this step. By an action of iridium thus diffused, it is possible to enhance the ferroelectric property such as the amount of residual polarization charges of the ferroelectric film 48.

In this crystallization annealing, crystallinity of a ferroelectric film 48*c* is enhanced by steeply raising the substrate temperature within a period shorter than that for the crystallization annealing illustrated in FIG. 8E. Therefore, a RTA chamber capable of achieving a high temperature rise rate is suitable for this crystallization annealing rather than a furnace with a low temperature rise rate.

In this embodiment, the RTA is performed for about 20 seconds at the substrate temperature of about 708° C.

Moreover, the annealing atmosphere does not have to contain a large amount of oxygen since this RTA is performed for the purpose of crystallization. When the annealing atmosphere includes oxygen and argon, the flow rate of argon may be set to 2 litter/min, while the flow rate of oxygen may be set to a small amount around 0.02 litter/min.

Incidentally, the degree of oxidation of the first upper electrode film 49*c*, which is formed by the reactive sputtering method, usually varies in the substrate surface due to the oxygen deficiencies as described previously.

To deal with this problem, in the next step, as illustrated in FIG. 8H, the oxygen deficiencies in the first upper electrode film 49*c* are compensated with oxygen in the annealing atmosphere by performing an annealing in an oxygen-containing atmosphere, thereby reducing variation in the degree of oxidation of the first upper electrode film 49*c* in the substrate surface.

This annealing is hereinafter referred to as oxidation annealing.

The oxidation annealing is performed for the purpose of compensating for the oxygen deficiencies in the first upper electrode film 49*c*. Accordingly, it is preferable to oxidize the first upper electrode film 49*c* efficiently by setting an oxygen concentration in the annealing atmosphere higher than that in the crystallization annealing illustrated in FIG. 8G.

Moreover, it is preferable to perform the annealing for a longer period than the crystallization annealing in FIG. 8G in order to sufficiently achieve such oxidation.

Viewing these points, the oxidation annealing is performed for a period ranging from 30 to 60 minutes in an annealing atmosphere of 100% oxygen while supplying oxygen either to a vertical furnace or to a horizontal furnace at a flow rate of about 60 litter/min in this embodiment.

Here, when the crystallization annealing (see FIG. 8G), to which the incompletely crystallized PZT is subjected, is performed for such a long period, there is a risk of deterioration in the ferroelectric property of the ferroelectric film 48 due to following reasons. Namely, the PZT crystal grains are not aligned, or lead which constitutes the PZT disengages out of the ferroelectric film 48 as the annealing period elapse.

On the other hand, the oxidation annealing in this step is performed after the PZT in the ferroelectric film 48 is almost completely crystallized and the ferroelectric property of the ferroelectric film 48 is determined. Accordingly, deterioration in the ferroelectric property does not become a problem even performing the oxidation annealing for a long period in the range from about 30 to 60 minutes as described above. Rather, it is possible to homogenize the degree of oxidation across the first upper electrode film 49*c* by performing the oxidation annealing for such a long period.

Moreover, when performing the oxidation annealing, the ferroelectric film 48 is already crystallized by the crystallization annealing. Here, the crystallinity may be disordered if a temperature higher than that at the time of the crystallization annealing is applied to the crystallized ferroelectric film 48.

Accordingly, from the viewpoint of stabilizing the crystallinity of the ferroelectric film 48, it is preferable to set the substrate temperature in the oxidation annealing lower than that in the crystallization annealing.

In this embodiment, the substrate temperature is set in a range from 400° C. to 600° C.

Here, it is preferable to set a relatively short annealing period around 30 minutes when the substrate temperature is set to 600° C., and to set a relatively long annealing period around 60 minutes when the substrate temperature is set to 400° C.

In the above description, the reactive sputtering method in which the iridium target is subjected to sputtering in the sputtering atmosphere containing oxygen is adopted as the method of depositing the first upper electrode film 49*c*. Instead, it is also possible to apply a sputtering method using a target made of iridium oxide, which is the same material as the first upper electrode film 49*c*. This sputtering method reduces in-plane variation in the degree of oxidation in the oxide iridium layer constituting the first upper electrode film 49*c* as compared to the reactive sputtering method. Accordingly, by performing the oxidation annealing of this step to the first upper electrode film 49*c*, it is possible to obtain the first upper electrode film 49*c* having the substantially uniform degree of oxidation across the surface thereof.

Subsequently, as illustrated in FIG. 8I, another iridium oxide layer (a second oxide film) serving as a second upper electrode film 49*d* is formed with a thickness of about 200 nm on the first upper electrode film 49*c* by the reactive sputtering method.

This second upper electrode film 49*d* is preferably made of iridium oxide having a higher degree of oxidation than that of the first upper electrode film 49*c* and a suppressed catalytic effect so as not to generate the hydrogen radicals from the moisture and the like in the outside atmosphere by the catalytic effect of iridium.

This iridium oxide film is deposited by using the sputtering gas made of a mixed gas of argon and oxygen and also by using an iridium target. The second upper electrode film 49*d* made of iridium oxide having the higher degree of oxidation than the first upper electrode film 49*c* can be formed by setting the flow rate ratio of oxygen in the sputtering gas higher than that in forming the first upper electrode film 49*c*.

Here, the degree of oxidation of the iridium oxide film constituting the second upper electrode film 49*d* may vary in the substrate surface as similar to the case of the first upper electrode film 49*c*.

Accordingly, in the next step, the in-plane variation in the degree of oxidation in the second upper electrode film 49*d* is reduced by subjecting the second upper electrode film 49*d* to the above-described oxidation annealing as illustrated in FIG. 8J.

The conditions of this oxidation annealing are the same as those described in FIG. 8H and description thereof is omitted herein.

Here, similar to the first upper electrode film 49*c*, it is also possible to further reduce the in-plane variation in the degree of oxidation by applying the sputtering method using a target made of iridium oxide as the method of depositing the second upper electrode film 49*d*, and then subjecting the second upper electrode film 49*d* thus formed to the oxidation annealing of this step.

Next, the steps for obtaining a cross-sectional structure illustrated in FIG. 8K are described.

First, an upper electrode 49*a* is formed by patterning the first and second upper electrode films 49*c* and 49*d* by photolithography. Then, in order to allow the ferroelectric film 48 to recover from damages incurred in this patterning process, the ferroelectric film 48 is subjected to recovery annealing in a vertical furnace. This recovery annealing is performed in an oxygen-containing atmosphere in which the flow rate of oxygen is 20 litter/min, under the conditions of the substrate temperature of 650° C. and a processing period of 60 minutes, for example.

Next, a capacitor dielectric film 48*a* made of the ferroelectric material such as PZT is formed by patterning the ferroelectric film 48 by photolithography. The capacitor dielectric film 48*a* recovers from damages incurred in this patterning process by performing recovery annealing. This recovery annealing is performed in an oxygen-containing atmosphere by using a vertical furnace, under the conditions of the oxygen flow rate of 20 litter/min, the substrate temperature of 350° C., and the processing period of 60 minutes.

Subsequently, as illustrated in FIG. 8L, an alumina film serving as a first insulative hydrogen barrier film 51 is formed with a thickness of about 50 nm by a sputtering method on the entire upper surface of the silicon substrate 30 in order to protect the capacitor dielectric film 48*a* against a reductive substance such as hydrogen or moisture.

Here, instead of the alumina film, the first insulative hydrogen barrier film 51 can be formed of any one of a titanium oxide ($TiO_x$) film, a zirconium oxide ($ZrO_x$) film, a magnesium oxide ($MgO_x$) film, and a titanium magnesium oxide ($MgTiO_x$) film.

Thereafter, in order to allow the capacitor dielectric layer 48*a* to recover from damages incurred in the sputtering process, the capacitor dielectric film 48*a* is subjected to recovery annealing for about 60 minutes at the substrate temperature of 550° C. in an oxygen-containing atmosphere in which the flow rate of oxygen is 20 litter/min. This recovery annealing is performed by use of a vertical furnace.

Next, as illustrated in FIG. 8M, the lower electrode film 47 below the capacitor dielectric film 48*a* is formed into a lower electrode 47*a* by patterning the lower electrode film 47 and the first insulative hydrogen barrier film 51 by photolithography. The first insulative hydrogen barrier film 51 is left so as to cover the lower electrode 47*a* in this patterning.

Note that a portion of the alumina film 40 which is not covered with the lower electrode 47*a* is also removed in this patterning.

Thereafter, in order to allow the capacitor dielectric film 48*a* to recover from damages incurred in the courses of this process, the capacitor dielectric film 48*a* is subjected to recovery annealing in an oxygen-containing atmosphere in which the flow rate of oxygen is 20 litter/min, under the conditions of the substrate temperature of 650° C. and the processing period of 60 minutes. This recovery annealing is performed by use of a vertical furnace, for example.

In the steps described so far, the ferroelectric capacitor Q formed by sequentially laminating the lower electrode 47*a*, the capacitor dielectric film 48*a*, and the upper electrode 49*a* in this order is formed on the first interlayer insulating film 45.

Although multiple ferroelectric capacitors Q are formed in the cell region $R_{cell}$ in an actual device, only one capacitor Q is illustrated in this embodiment for the purpose of simplification.

Subsequently, as illustrated in FIG. 8N, another alumina film serving as a second insulative hydrogen barrier film 53 for protecting the capacitor Q is formed with a thickness of about 20 nm on the entire upper surface of the silicon substrate 30 by the sputtering method. This second insulative hydrogen barrier film 53 cooperates with the first insulative hydrogen barrier film 51 located therebelow and function as preventing the reductive substance such as hydrogen or moisture from reaching the capacitor dielectric film 48*a*. Thereby, deterioration in the ferroelectric property of the capacitor dielectric film 48*a* due to the reduction is suppressed.

In addition to the alumina film, there are other films having the same function, namely a titanium oxide film, a zirconium oxide film, a magnesium oxide film, and a titanium magnesium oxide film. Any of these films may be formed as the second insulative hydrogen barrier film 53.

Then, the capacitor dielectric film 48*a* is subjected to recovery annealing in a vertical furnace filled with an oxygen-containing atmosphere under the conditions of the substrate temperature of 550° C. and the processing period of 60 minutes. In this recovery annealing, the flow rate of oxygen is set to 20 litter/min, for example.

Next, as illustrated in FIG. 8O, a silicon oxide film is formed with a thickness of about 1500 nm on the second insulative hydrogen barrier film 53 by the plasma CVD method using TEOS gas. This silicon oxide film serves as a second interlayer insulating film 55.

Then, after planarizing an upper surface of the second interlayer insulating film 55 by the CMP method, $N_2O$ plasma processing is performed as dehydration processing for the second interlayer insulating film 55. In this case, the substrate temperature is set to 350° C. and the processing period is set to 2 minutes.

The second interlayer insulating film 55 is dehydrated by this $N_2O$ plasma processing. In addition, an upper surface of the second interlayer insulating film 55 is nitrided so as to prevent reabsorption of moisture.

Next, the steps for obtaining a cross-sectional structure illustrated in FIG. 8P are described.

First, a photoresist is coated on the second interlayer insulating film 55, and the photoresist is exposed and developed to form a first resist pattern 57 provided with first windows 57*a* of a hole shape.

Next, first holes 58*a* are formed in the insulating films below the first windows 57*a* by dry etching the series of films from the second interlayer insulating film 55 to the cover insulating film 44 while using this first resist pattern 57 as a mask.

This dry etching is performed by use of a parallel plate type plasma etching apparatus (not illustrated). Moreover, a mixed gas of $C_4F_8$, $O_2$, and Ar is used as an etching gas for the first and second interlayer insulating films 45 and 55 and the cap insulating film 46 which are made of silicon oxide. Here, it is also possible to add CO gas to these gases in some cases. Moreover, the second insulative hydrogen barrier film 53 made of alumina is also etched by a sputtering effect of this etching gas.

In the meantime, a mixed gas of $CHF_3$, $O_2$, and Ar is used as an etching gas for the cover insulating film 44 made of silicon oxy-nitride.

The first resist pattern 57 is removed after the above-described etching is completed.

Next, the steps for obtaining a cross-sectional structure illustrated in FIG. 8Q are described.

First, a titanium (Ti) film and a titanium nitride (TiN) film are formed with thicknesses of 20 nm and 50 nm, respectively, on inner surfaces of the first holes 58*a* and on an upper surface of the second interlayer insulating film 55 by the sputtering method. The titanium film and the titanium nitride film thus formed serve as a glue film. Then, a tungsten film is formed with a thickness of 500 nm on the glue film by the CVD method using tungsten hexafluoride gas. Hence, the first holes 58*a* are completely buried with this tungsten film.

Thereafter, the excessive glue film and the tungsten film on the second interlayer insulating film 55 are polished and removed by the CMP method and these films are left in the first holes 58*a* as first conductive plugs 60.

Among these conductive plugs, the first conductive plugs 60 formed in the cell region $R_{cell}$ are electrically connected to the first and second source/drain regions 39*a* and 39*b*. Meanwhile, the first conductive plugs 60 formed in the logic circuit region $R_{logic}$ are electrically connected to the third source/drain regions 39*c*. Moreover, the first conductive plug 60 formed in the peripheral circuit region $R_{peripheral}$ is electrically connected to the wiring 36.

Here, after forming the first conductive plugs 60, it is also possible to subject the second interlayer insulating film 55 to the $N_2O$ plasma processing so as to dehydrate the second interlayer insulating film 55 and to prevent reabsorption of moisture. This dehydration processing is performed under the conditions of the substrate temperature of 350° C. and the processing period of 2 minutes, for example.

Incidentally, the first conductive plugs 60 are mainly made of tungsten which is highly susceptible to oxidation. Accordingly, the first conductive plugs 60 may cause contact defects since the tungsten is easily oxidized in the oxygen-containing atmosphere.

Therefore, in the next step, a silicon oxy-nitride film serving as an oxidation prevention film 61 is formed with a thickness of 100 nm on respective upper surfaces of the first conductive plugs 60 and the second interlayer insulating film 55 by the plasma CVD method as illustrated in FIG. 8R in order to prevent oxidation of the first conductive plugs 60.

Next, the steps for obtaining a cross-sectional structure illustrated in FIG. 8S are described.

First, a photoresist is coated on the oxidation prevention film 61 and the photoresist is exposed and developed to form a resist pattern 63. As illustrated in the drawing, second and third windows 63*a* and 63*b* of a hole shape are formed in the second resist pattern 63 over the upper electrode 49*a* and the lower electrode 47*a*, respectively.

Next, a second hole 55*a* is formed over the upper electrode 49*a* and a third hole 55*b* is formed over a contact region of the lower electrode 47*a* by dry etching the oxidation prevention film 61, the second interlayer insulating film 55, and the first and second insulative hydrogen barrier films 51 and 53 while using the second resist pattern 63 as a mask.

Then, after removing the second resist pattern 63, the silicon substrate 30 is put into a vertical furnace filled with an oxygen-containing atmosphere and the capacitor dielectric film 48*a* is subjected to recovery annealing under conditions of the substrate temperature of 500° C. and the processing period of 60 minutes in order to allow the capacitor dielectric film 48*a* to recover from damages incurred from the series of processes performed so far. At this time, the flow rate of oxygen is set to 20 litter/min, for example.

Thereafter, the oxidation prevention film 61 is etched back and removed.

Next, as illustrated in FIG. 8T, a metal laminated film 65 is formed by the sputtering method to on the respective upper surfaces of the second interlayer insulating film 55 and the first conductive plugs 60 and on inner surfaces of the second and third holes 55*a* and 55*b*. In this embodiment, a titanium nitride film with a thickness of about 150 nm, a copper-containing aluminum film with a thickness of about 550 nm, a titanium film with a thickness of about 5 nm, and a titanium nitride film with a thickness of about 150 nm are sequentially formed in this order as the metal laminated film 65.

Subsequently, as illustrated in FIG. 8U, a photoresist is coated on the metal laminated film 65 and the photoresist is exposed and developed to form a third resist pattern 62.

Next, as illustrated in FIG. 8V, the metal laminated film 65 is formed into first layer metal wirings 65*a* by dry etching the metal laminated film 65 while using the third resist pattern 62 as a mask.

Among the first layer metal wirings 65*a*, those formed over the capacitor Q are electrically connected to the upper electrode 49*a* and the lower electrode 47*a* through the first and second holes 55*a* and 55*b*, respectively.

Thereafter, the third resist pattern 62 is removed by asking.

Next, as illustrated in FIG. 8W, an alumina film is formed as a third insulative hydrogen barrier film 66, which covers the first layer metal wirings 65*a* and the second interlayer insulating film 55, by the sputtering method. The thickness of the third insulative hydrogen barrier film 66 is within a range of 5 nm to 30 nm, for example 20 nm.

This third insulative hydrogen barrier film 66 has a function to block reductive substance such as hydrogen or moisture and thereby to protect the capacitor dielectric film 48*a*. In addition to the alumina film, there are other films having the same functions, namely a titanium oxide film, a zirconium oxide film, a magnesium oxide film, and a titanium magnesium oxide film. Any one of these films may be formed as the third insulative hydrogen barrier film 66.

Meanwhile, it is also possible to omit the third insulative hydrogen barrier film 66 when deterioration of the capacitor dielectric film 48*a* by hydrogen does not matter.

Thereafter, the steps for forming a second interlayer insulating film and second layer metal wirings on the third insulative hydrogen barrier layer 66 is performed. However, detailed description of those steps is omitted herein.

In this way, the basic structure of the ferroelectric memory of this embodiment is completed.

According to the present embodiment described above, the first upper electrode film 49*c*, which is made of iridium oxide and formed by the reactive sputtering method, is subjected to the oxidation annealing as explained in conjunction with FIG. 8H.

Figure 9A:
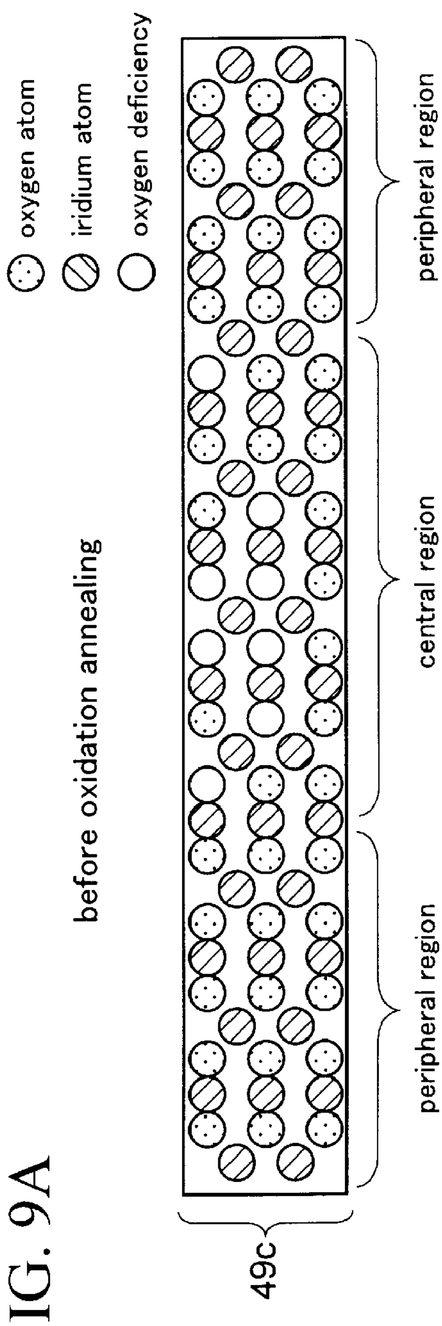
FIGS. 9A and 9B are schematic cross-sectional views of a first upper electrode film before and after oxidation annealing in the first embodiment of the present invention.
Figure 9B:
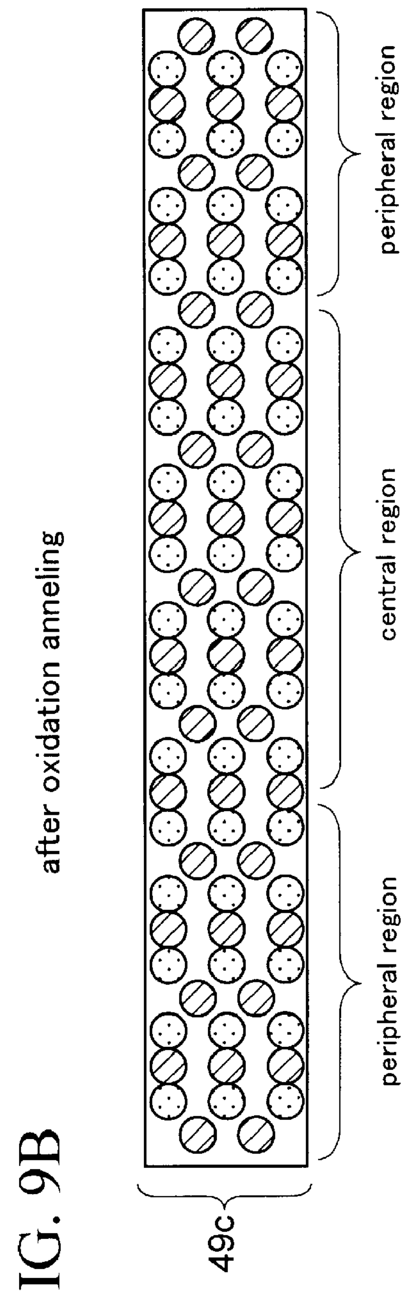

FIGS. 9A and 9B are schematic cross-sectional views of the first upper electrode film 49*c* before and after the oxidation annealing respectively.

As illustrated in FIG. 9A, before the oxidation annealing, more oxygen deficiencies occur in a central region of the substrate as compared to a peripheral region of the substrate due to reasons such as inadequate oxidation of iridium in the sputtering atmosphere.

Such oxygen deficiencies are compensated by the oxidation annealing as illustrated in FIG. 9B.

In this way, it is possible to suppress variation in the degree of oxidation of the first upper electrode film 49*c* attributable to the oxygen deficiencies and thereby to obtain the first upper electrode film 49*c* with an improved degree of oxidation across the substrate surface. As a consequence, it is possible to suppress the catalytic effect of iridium oxide having the low degree of oxidation and to prevent generation of hydrogen radicals from moisture and the like contacting the first upper electrode film 49*c*. Accordingly, the capacitor dielectric film 48*a* is hardly deteriorated in the course of manufacture due to the hydrogen radicals and the like. Moreover, it is possible to maintain high ferroelectric property such as an amount of residual polarization charges of the capacitor dielectric film 48*a* even after the manufacturing process is completed.

Moreover, since the variation in the degree of oxidation in the substrate surface is suppressed, sheet resistance of the first upper electrode film 49*c* is substantially uniform in the substrate surface. Hence, it is possible to make a voltage applied from the upper electrode 49*a* to the capacitor dielectric film 48*a* substantially uniform in the substrate surface. In this way, it is possible to prevent a situation in which the electric properties of the individual ferroelectric capacitors Q formed on the silicon substrate 30 vary among the capacitors.

Second Embodiment

The first embodiment describes the method of suppressing the in-plane variation in the degree of oxidation in each of the upper electrodes films 49*c* and 49*d* by performing the oxidation annealing.

In contrast, the present embodiment describes a method which is useful for suppressing the etching of the upper electrode 49*a* at the time of formation of the second hole 55*a* (FIG. 8S).

FIGS. 10A to 10E are cross-sectional views in the process of manufacturing a ferroelectric memory according to this embodiment. In these drawings, the same constituents as those in the first embodiment are denoted by the same reference numerals used in the first embodiment and description thereof is omitted below.

To manufacture this ferroelectric memory, the steps of FIGS. 8A to 8J described in the first embodiment are firstly performed. Thus, the structure provided with the second upper electrode film 49*d* on the uppermost layer of the silicon substrate 30 is obtained.

Figure 10A:
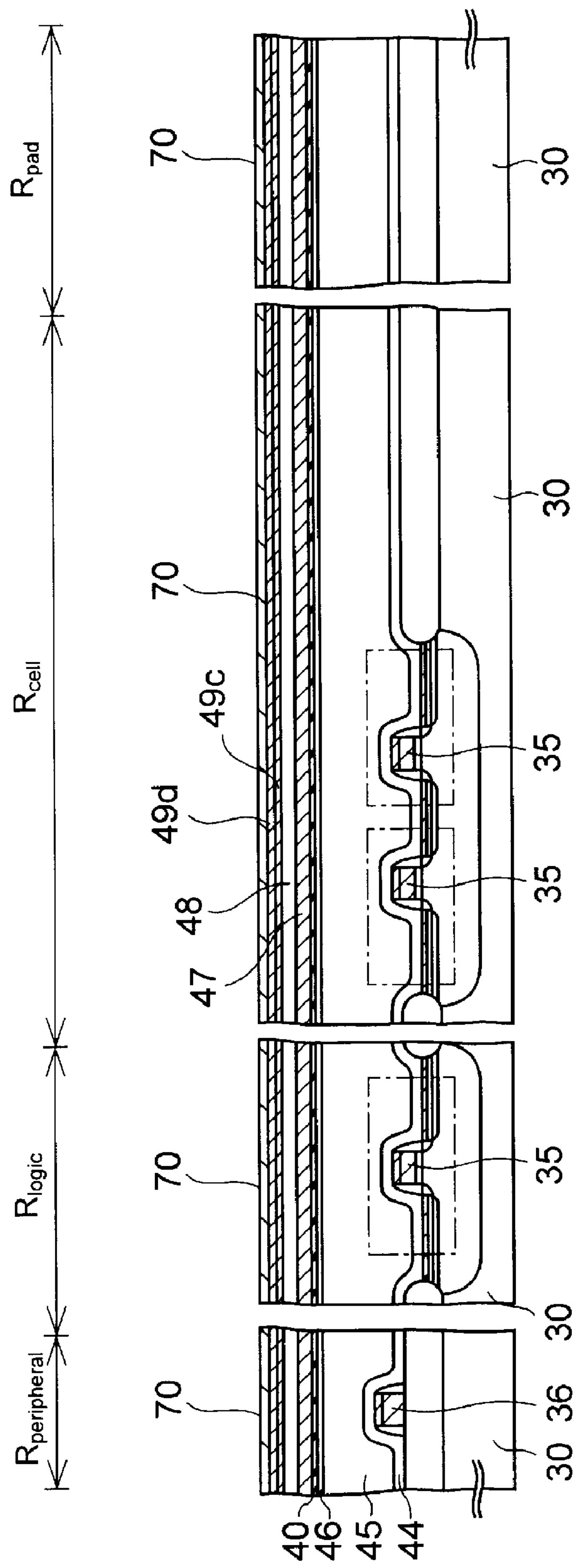
FIGS. 10A to 10E are cross-sectional views in the process of manufacturing a ferroelectric memory according to a second embodiment of the present invention.

Next, as illustrated in FIG. 10A, a metal film 70 is deposited on the second upper electrode film 49*d* by the sputtering method.

Here, it is preferable to deposit either a titanium alloy film or a noble metal film as the metal film 70, for example.

Examples of the titanium alloy film applicable to this embodiment include a titanium nitride (TiN) film, a titanium aluminum nitride (TiAlN) film, a titanium aluminum (TiAl) film, and a titanium aluminum copper (TiAlCu) film.

Meanwhile, the noble metal film may be a gold film, a silver film, a platinum film, a palladium film, a rhodium film, an iridium film, a ruthenium film, and an osmium film.

Of these films, a titanium nitride film is formed as the metal film 70 in this embodiment with a thickness ranging from 20 nm to 30 nm.

Figure 10B:
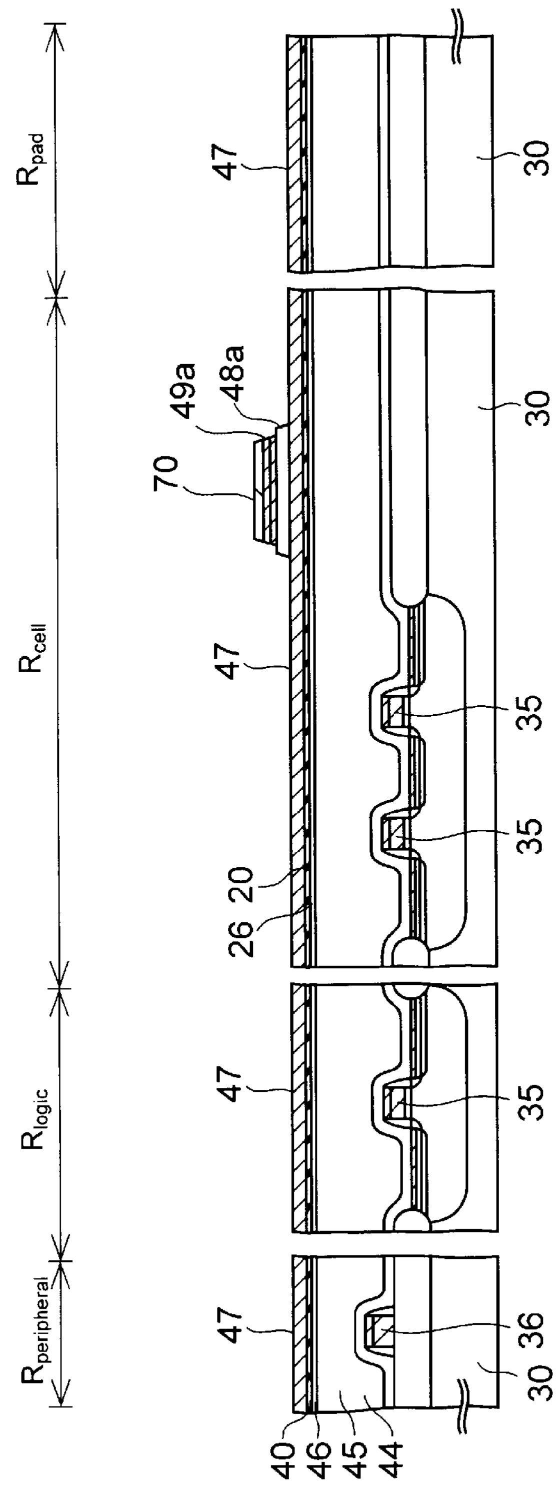

Next, as illustrated in FIG. 10B, the metal film 70 and the first and second upper electrode films 49*c* and 49*d* are patterned by dry etching while using an unillustrated resist pattern as a mask. As a result, the upper electrode films 49*c* and 49*d* are formed into the upper electrode 49*a*, and the metal film 70 is left as an island on the upper electrode 49*a*.

When the metal film 70 is made of the titanium alloy such as titanium nitride, a mixed gas of $BCl_3$ gas at a flow rate of about 140 sccm and chlorine ($Cl_2$) gas at a flow rate of 100 sccm is used as an etching gas for the metal film 70.

On the other hand, when the metal film 70 is made of a noble metal such as iridium, a mixed gas of chlorine gas at a flow rate of about 12 sccm and argon (Ar) gas at a flow rate of 48 sccm is used as an etching gas for the metal film 70.

Thereafter, the capacitor dielectric film 48*a* is formed below the upper electrode 49*a* by patterning the ferroelectric film 48.

Figure 10C:
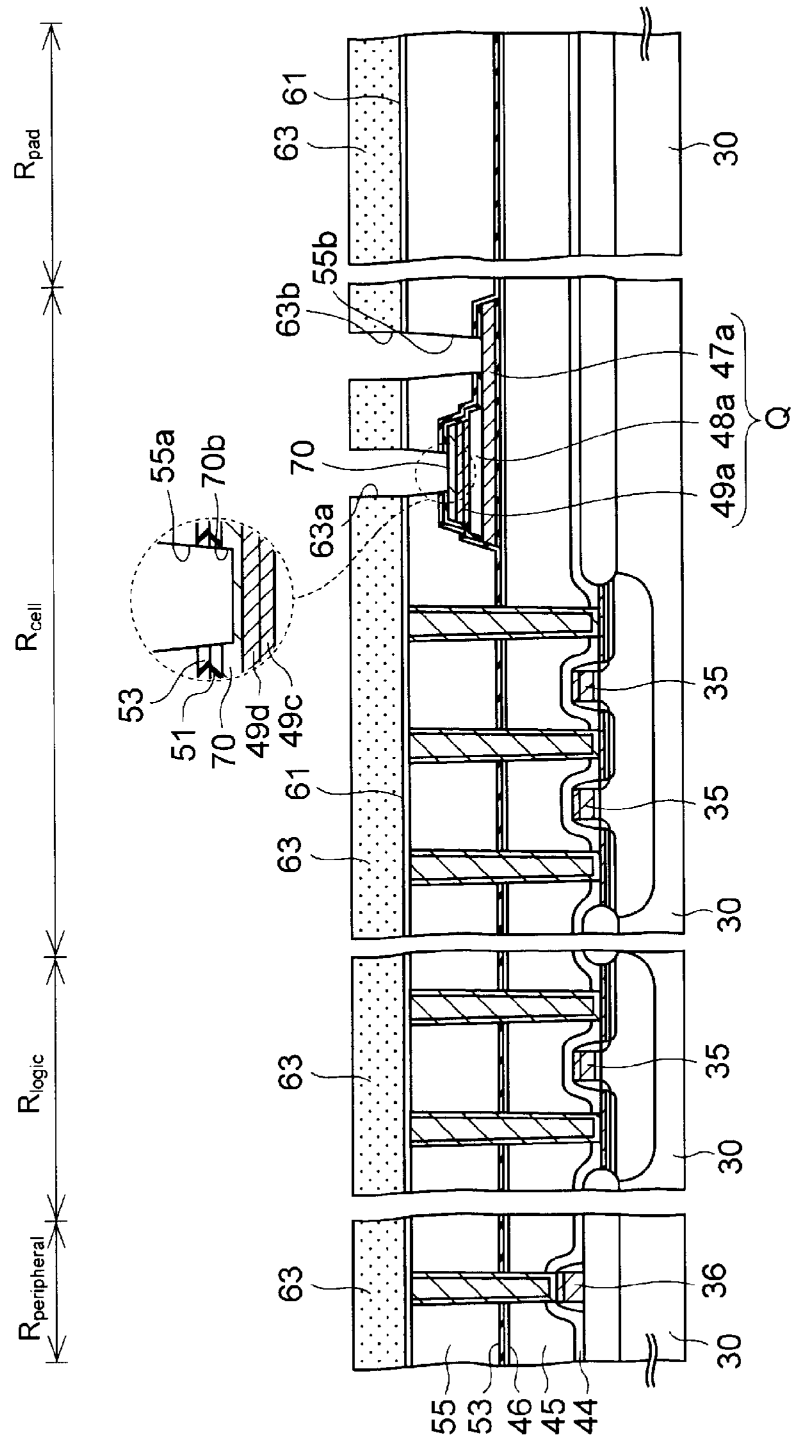

Next, as illustrated in FIG. 10C, the steps of FIGS. 8L to 8S described in the first embodiment are performed to form the second and third holes 55*a* and 55*b* in the second interlayer insulating film 55 over the electrodes 49*a* and 47*a*, respectively.

Here, these holes 55*a* and 55*b* are formed by dry etching the second interlayer insulating film 55 while using the second resist pattern 63 as a mask and using the metal film 70 as an etching stopper. In this step, over-etching is performed in order to prevent the holes 55*a* and 55*b* from being incompletely opened.

As a result, the etching reaches the metal film 70 as illustrated in a dotted-line circle, whereby a concave portion 70*b* is formed in the metal film 70 below the second hole 55*a*.

An etching rate of the dry etching process usually varies in the substrate surface. Hence, the depth of the concave portion 70*b* also varies in the substrate surface. Accordingly, when the concave portion 70*b* reach the upper electrode 49*a*, the volume of the upper electrode 49*a* varies in the substrate surface, and a resistance value of the upper electrode 49*a* determined based on its volume also varies in the substrate surface.

To prevent such inconvenience, it is preferable to form the metal film 70 with the thickness equal to or above 20 nm thereby preventing the upper electrode 49*a* from being over-etched.

However, if the metal film 70 is too thick, a sum of resistance values of the upper electrode 49*a* and the metal film 70 increases, and the voltage to be applied from the upper electrode 49*a* to the capacitor dielectric film 48*a* is reduced. Accordingly, it is preferable to form the metal film 70 with the thickness equal to or below 30 nm.

Thereafter, the second resist pattern 63 is removed.

Figure 10D:
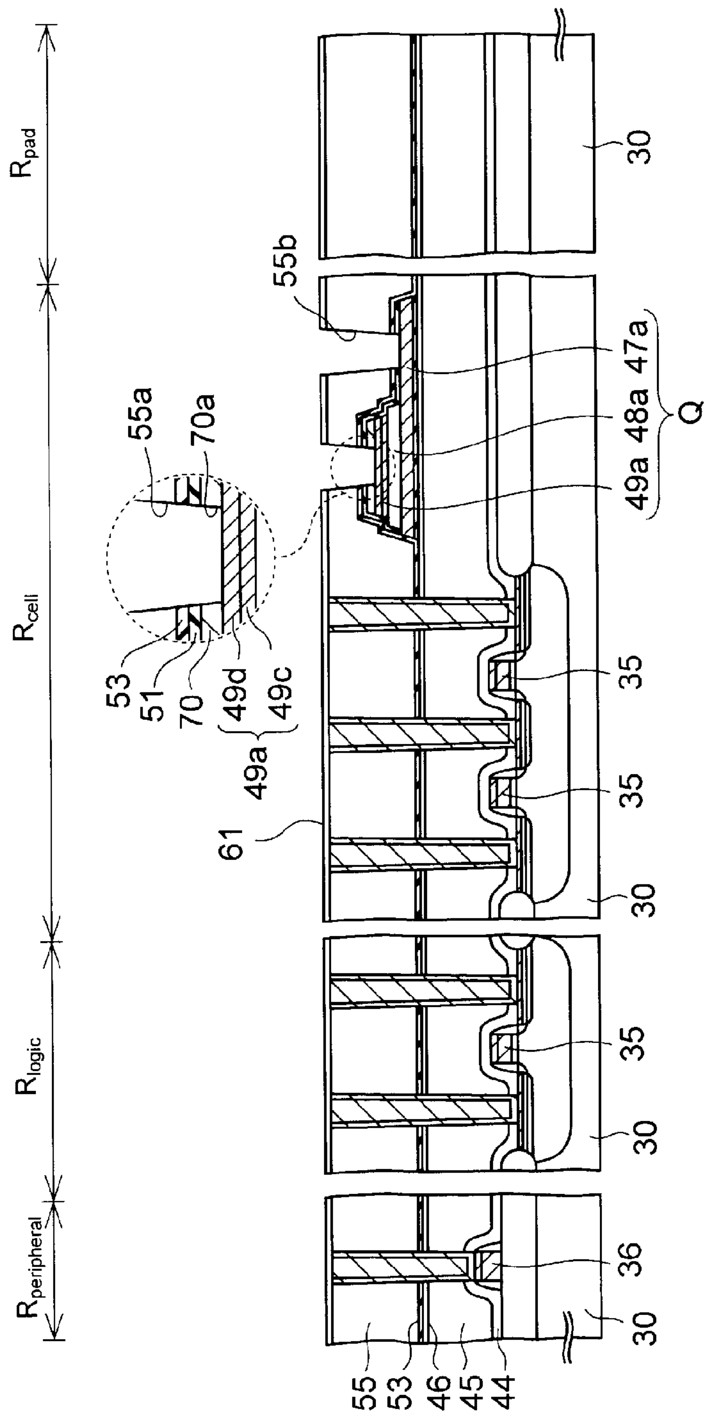

Next, as illustrated in FIG. 10D, an opening 70*a* is formed by wet etching the metal film 70 below the second hole 55*a*. Thus, the upper electrode 49*a* is exposed from the opening 70*a* in the second hole 55*a*.

This wet etching is preformed by using an etchant with which the metal film 70 is etched at a faster etching rate than the iridium oxide film constituting the upper electrode 49*a* is etched.

When the metal film 70 is formed of the titanium alloy film such as titanium nitride film, a mixed solution of $H_2O_2$, $NH_4OH$, and $H_2O$ (ammonium hydrogen peroxide mixture) can be used as the etchant. The titanium alloy film containing nitrogen such as the titanium nitride film or the titanium aluminum nitride film hardly forms an oxide layer on a surface thereof as compared to those which do not contain nitrogen, and is therefore easily etched by the ammonium hydrogen peroxide mixture without being blocked by the oxide layer.

By opening the concave portion 70*b* by wet etching in this manner, it is possible to eliminate the variation in the resistance of the metal film 70 which is attributable to the variation in the depth of the concave portion 70*b* in the substrate surface. Accordingly, the sum of the resistance values of the upper electrode 49*a* and the metal film 70 is almost uniform in the substrate surface. Thus, voltage value to be applied from the upper electrode 49*a* to the capacitor dielectric film 48*a* can be made substantially constant in the substrate surface.

Here, instead of the wet etching, it is also conceivable to employ downflow etching, reactive ion etching (RIE), or parallel plate type or other types of plasma etching. However, plasma etching is apt to form the concave portion in the upper electrode 49*a* by a sputtering effect of an etching gas and is also apt to damage the capacitor dielectric film 48*a* due to plasma damage. Therefore, it is preferable to apply the wet etching from the viewpoints of suppressing formation of the concave portion in the upper electrode 49*a* and of preventing damages on the capacitor dielectric film 48*a*.

Meanwhile, it is possible to omit wet etching in this step when the metal film 70 is made of noble metal such as iridium.

Figure 11:
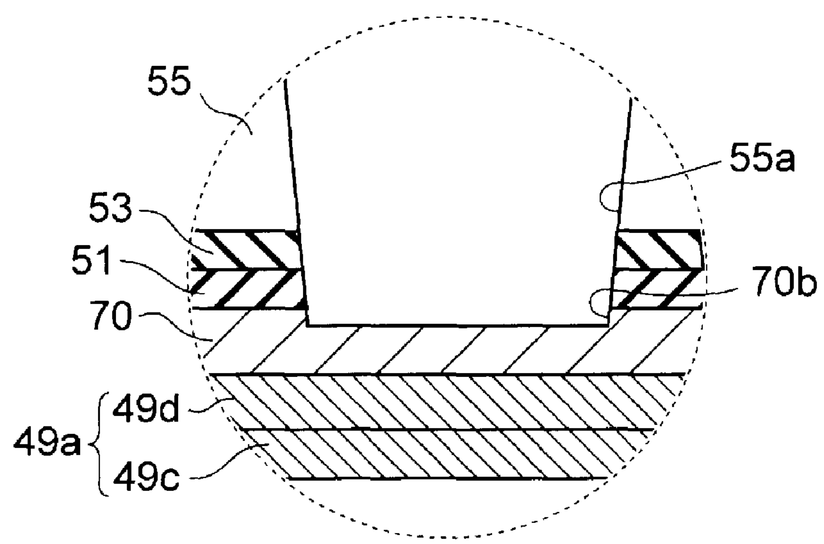
FIG. 11 is an enlarged cross-sectional view in a case of omitting wet etching of a metal film made of noble metal in the second embodiment of the present invention.

FIG. 11 is an enlarged cross-sectional view illustrating the case of omitting the wet etching for the metal film 70 made of noble metal.

The noble metal film is more difficult to be dry etched than the titanium alloy film. Accordingly, the depth of the concave portion 70*b* is smaller by its nature and the variation in the depth in the substrate surface is also smaller. Therefore, the variation in the sum of the resistance values of the metal film 70 and the upper electrode 49*a* is smaller even if the wet etching process is omitted. Hence, the value of the voltage to be applied from the upper electrode 49*a* to the capacitor dielectric film 48*a* is substantially constant in the substrate surface.

Figure 10E:
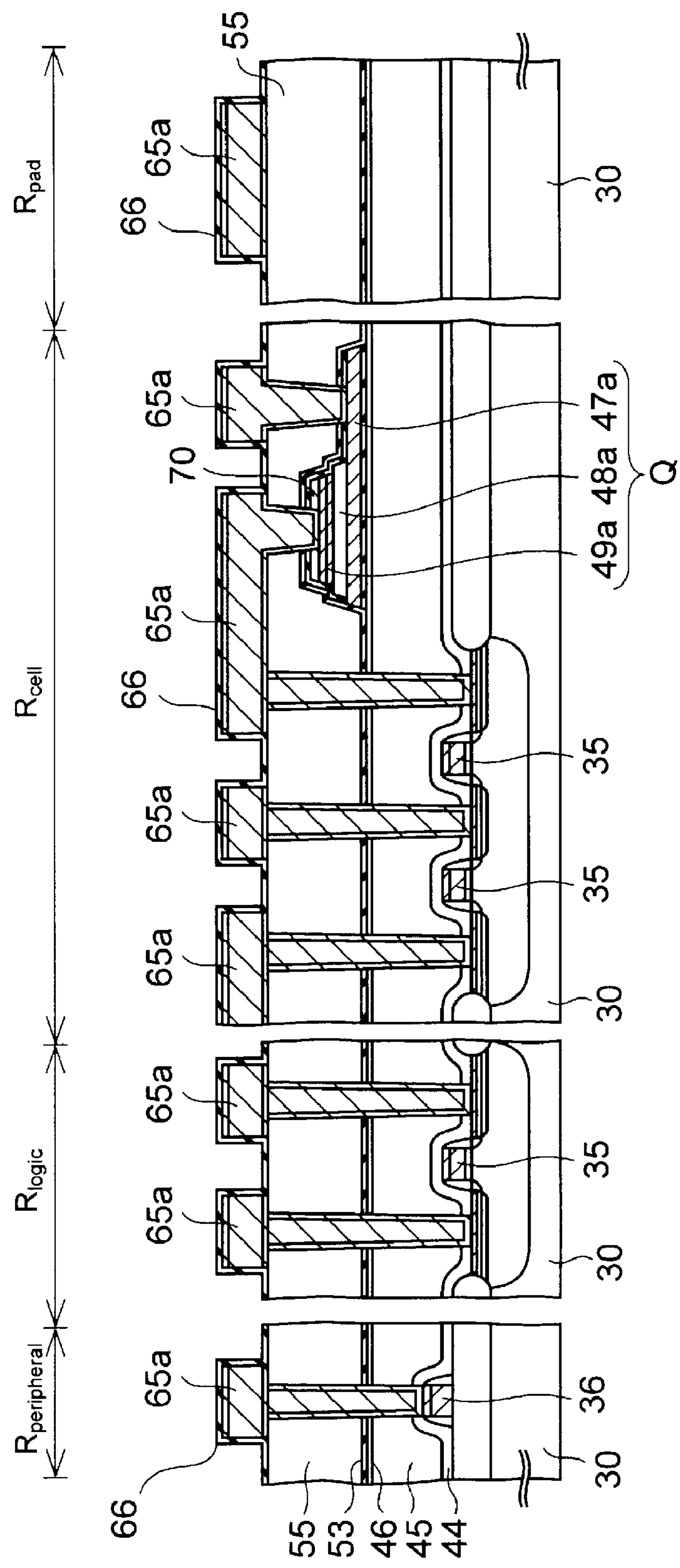

Thereafter, the oxidation prevention insulating film 61 is etched back and removed, and the steps of FIGS. 8T to 8W described in the first embodiment are performed. Thus, the basic structure of the ferroelectric capacitor of this embodiment is completed as illustrated in FIG. 10E.

According to the above-described present embodiment, the metal film 70 is formed on the second upper electrode film 49*d* as illustrated in FIG. 10D so that the upper electrode 49*a* is not etched when the second hole 55*a* is formed (FIG. 10C).

When the metal film 70 is made of the titanium alloy film, the concave portion 70*b* of the metal film 70 is removed by wet etching the metal film 70 below the second hole 55*a* as illustrated in FIG. 10D. Accordingly, it is possible to prevent the variation in the sum of the resistance values of the metal film 70 and the upper electrode 49*a* attributable to the variation in the depth of the concave portion 70*b* in the substrate surface.

Further, it is also possible to prevent deterioration in the fatigue property of the ferroelectric capacitor Q as illustrated in FIG. 6 by removing the concave portion 70*b* as described above.

Figure 12:
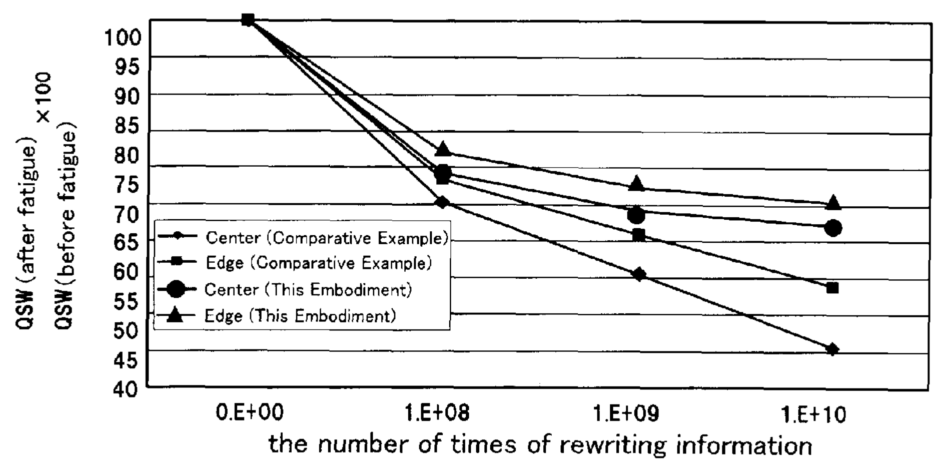
FIG. 12 is a graph obtained by investigating a fatigue property of a ferroelectric capacitor Q in the second embodiment of the present invention.

FIG. 12 is a graph obtained by investigating fatigue properties of the ferroelectric capacitors Q of this embodiment.

The horizontal axis of this graph indicates the number of times of rewriting information in the capacitor Q. Meanwhile, the vertical axis indicates a ratio (fatigue property) between an amount of residual polarization charge (Qsw) of the capacitor dielectric film 48*a* after rewriting information to (after fatigue) for a predetermined number of times and an amount of residual polarization charge thereof before rewriting the information (before fatigue).

Moreover, "Center (Comparative Example)" and "Edge (Comparative Example)" respectively mean fatigue properties in a central region and a peripheral region of the silicon substrate 30 when omitting the metal film 70. Meanwhile, "Center (This Embodiment)" and "Edge (This Embodiment)" respectively mean fatigue properties in a central region and a peripheral region of the silicon substrate 30 when forming the metal film 70 as in this embodiment.

As illustrated in this graph, the fatigue properties in both of the central region and the peripheral region of the silicon substrate 30 of this embodiment exhibit higher values than that of the comparative example after rewriting information for $1\times10^{10}$ times.

Hence, it is confirmed that the removal of the concave portion 70*b* by wet etching is effective for improving the fatigue properties of the ferroelectric capacitors Q.

When the metal film 70 is made of noble metal which is less susceptible to etching, the depth of the concave portion 70*b* to be formed in the step of etching the second hole 55*a* is smaller by its nature, and the concave portion 70*b* therefore has a smaller influence on the fatigue property and the like. Therefore, the wet etching process for removing the concave portion 70*b* may be omitted and the concave portion 70*b* may be left.

It is also preferable in this embodiment to subject the first and second upper electrode films 49*c* and 49*d* to the oxidation annealing as described in the first embodiment, thereby suppressing the variation in the degrees of oxidation in these electrode films in the substrate surface.

Figure 13A:
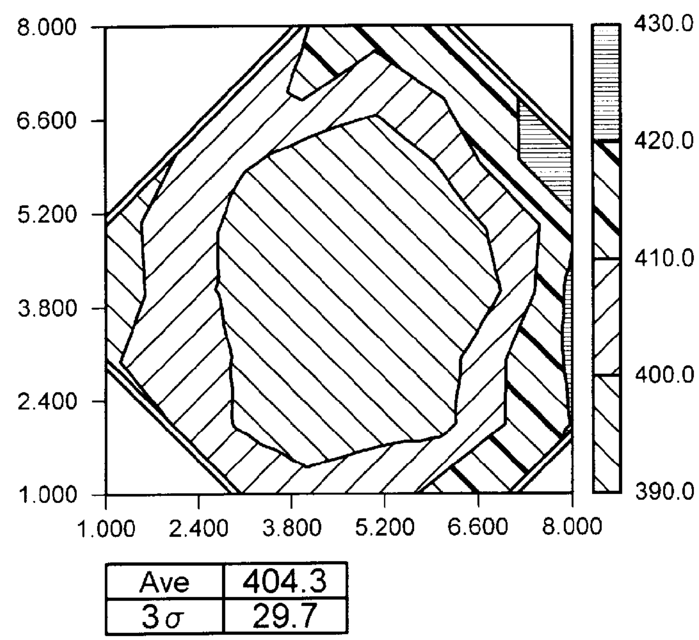
FIGS. 13A to 13C are views illustrating in-plane distribution of sheet resistance in cases of bonding first and second upper electrode films subjected to oxidation annealing to the metal film.
Figure 13B:
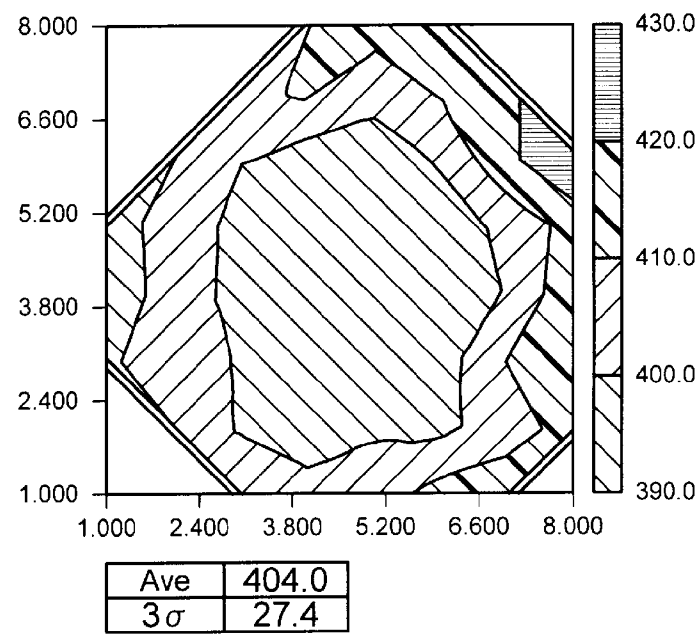
Figure 13C:
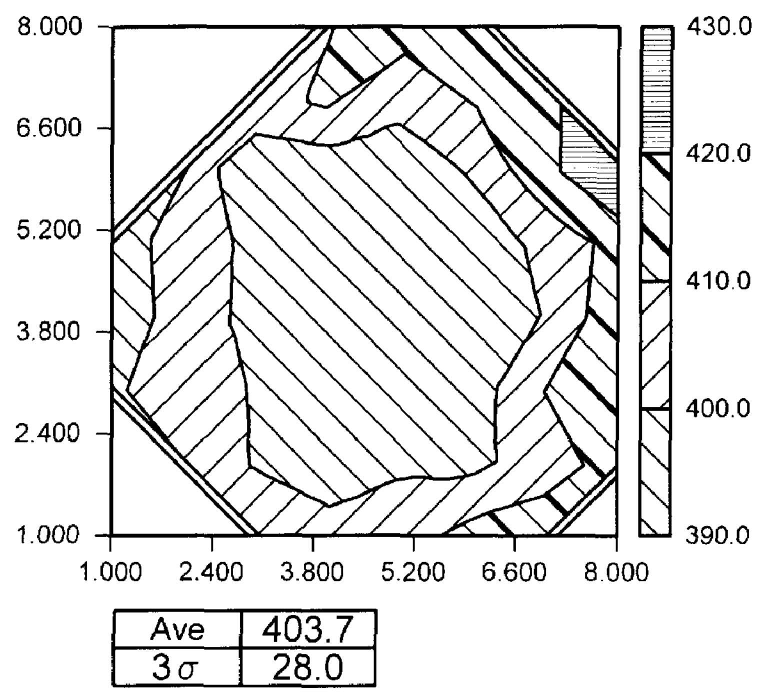

FIGS. 13A to 13C are views illustrating measurement results on three silicon substrates 30, respectively. Here, each measurement result is that of in-plane distribution of sheet resistance ($\Omega$/60 $\mu m^2$) being total of the metal film 70 and the first and second upper electrode films 49*c* and 49*d* subjected to the oxidation annealing as described above. Note that units of scales on the vertical axis and the horizontal axis in the drawings represent the number of chips whose length of sides is 20 mm.

As illustrated in the drawings, in-plane uniformity of the sheet resistance is improved by performing the oxidation annealing as compared to the case of not performing the oxidation annealing (FIGS. 4A to 4C).

Hence it is understood that the oxidation annealing is also useful in this embodiment for homogenizing the sheet resistance.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be made hereto without departing from the spirit and scope of the invention.

What is claimed is:

1. A ferroelectric memory comprising:
- a semiconductor substrate;
- a transistor formed on the semiconductor substrate; and
- a ferroelectric capacitor formed over the transistor, wherein the ferroelectric capacitor includes:
- a lower electrode;
- a ferroelectric film formed over the lower electrode;
- an upper electrode formed over the ferroelectric film;
- a metal film formed over the upper electrode;
- an insulating film covering the ferroelectric capacitor;
- a hole formed through the insulating film and the metal film; and
- a conductive plug formed in the hole and being contact to the upper electrode.

2. The ferroelectric memory according to claim 1, wherein the upper electrode has a laminated structure of a first oxide film and a second oxide film.

3. The ferroelectric memory according to claim 2, wherein each of the first oxide film and the second oxide film is an iridium oxide film.

4. The ferroelectric memory according to claim 1, wherein the metal film contains titanium.

5. The ferroelectric memory according to claim 1, wherein the metal film is made of noble metal.

6. The ferroelectric memory according to claim 5, further comprising:

an insulating film covering the ferroelectric capacitor and including a hole over the metal film; and a conductive plug formed in the hole and electrically connected to the upper electrode, wherein a concave portion is formed in the metal film below the hole.

7. The ferroelectric memory according to claim 1, wherein the metal film has a film thickness in a range from 20 nm to 30 nm.

8. A method of manufacturing a ferroelectric memory, comprising:

forming a transistor on a semiconductor substrate;

forming a lower electrode film over the transistor;

forming a ferroelectric film over the lower electrode film;

forming a first upper electrode film over the ferroelectric film;

forming a second upper electrode film over the first upper electrode film; and forming a metal film over the second upper electrode film;

forming an insulating film covering the ferroelectric capacitor;

forming a hole through the insulating film and the metal film; and forming a conductive plug in the hole, the conductive plug being contact to the upper electrode.

9. The method of manufacturing a ferroelectric memory according to claim 8, further comprising:

forming the hole through in the metal film by wet etching after forming the hole through the insulating film.

10. The method of manufacturing a ferroelectric memory according to claim 9, wherein the wet etching uses an etchant with which the metal film is etched at a faster etching rate than the first upper electrode film and the second upper electrode film are etched.

11. The method of manufacturing a ferroelectric memory according to claim 10, wherein oxide iridium films are formed as the first upper electrode film and the second upper electrode film, a film containing titanium is formed as the metal film, and an ammonium hydrogen peroxide mixture is used as the etchant.

12. The method of manufacturing a ferroelectric memory according to claim 8, wherein a noble metal film is formed as the metal film.

* * * * *